(12) United States Patent
Lee et al.

(10) Patent No.: US 9,508,832 B2
(45) Date of Patent: Nov. 29, 2016

(54) METHOD OF FABRICATING A SEMICONDUCTOR DEVICE

(71) Applicant: Samsung Electronics Co., Ltd., Suwon-si, Gyeonggi-do (KR)

(72) Inventors: Hyun Jung Lee, Suwon-si (KR); Bonyoung Koo, Suwon-si (KR); Sunjung Kim, Suwon-si (KR); Jongryeol Yoo, Osan-si (KR); Seung Hun Lee, Hwaseong-si (KR); Poren Tang, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/749,037

(22) Filed: Jun. 24, 2015

(65) Prior Publication Data

US 2016/0056269 A1    Feb. 25, 2016

(30) Foreign Application Priority Data

Aug. 22, 2014    (KR) .......................... 10-2014-0109653

(51) Int. Cl.
| | |
|---|---|
| *H01L 21/306* | (2006.01) |
| *H01L 21/308* | (2006.01) |
| *H01L 21/336* | (2006.01) |
| *H01L 29/66* | (2006.01) |
| *H01L 21/762* | (2006.01) |

(Continued)

(52) U.S. Cl.
CPC ..... *H01L 29/66795* (2013.01); *H01L 21/3085* (2013.01); *H01L 21/76224* (2013.01); *H01L 21/823412* (2013.01); *H01L 21/823807* (2013.01)

(58) Field of Classification Search
CPC ............. H01L 21/306; H01L 21/30625; H01L 21/3085; H01L 21/3086; H01L 21/02532; H01L 21/0245; H01L 21/76224; H01L 21/823431; H01L 21/823821; H01L 29/66795; H01L 29/785; H01L 27/0886; H01L 27/0924; H01L 21/823807; H01L 21/823412
See application file for complete search history.

(56) References Cited

U.S. PATENT DOCUMENTS

| | | |
|---|---|---|
| 7,193,279 B2 | 3/2007 | Doyle et al. |
| 7,229,901 B2 | 6/2007 | Savage |

(Continued)

FOREIGN PATENT DOCUMENTS

| | | |
|---|---|---|
| JP | 2009-130289 A | 6/2009 |
| KR | 10-2007-0089743 A | 8/2007 |

(Continued)

*Primary Examiner* — Mary Wilczewski
(74) *Attorney, Agent, or Firm* — Harness, Dickey & Pierce, P.L.C.

(57) ABSTRACT

A method of fabricating a semiconductor device includes forming a channel layer on a substrate, forming a sacrificial layer on the channel layer, forming a hardmask pattern on the sacrificial layer, and performing a patterning process using the hardmask pattern as an etch mask to form a channel portion with an exposed top surface. The channel and sacrificial layers may be formed of silicon germanium, and the sacrificial layer may have a germanium content higher than that of the channel layer.

17 Claims, 35 Drawing Sheets

(51) Int. Cl.
*H01L 21/8238* (2006.01)
*H01L 21/8234* (2006.01)

(56) References Cited

U.S. PATENT DOCUMENTS

| | | | |
|---|---|---|---|
| 7,393,733 B2* | 7/2008 | Currie | H01L 21/82380 257/E21.633 |
| 7,648,853 B2 | 1/2010 | Bauer | |
| 8,274,097 B2 | 9/2012 | Cheng | |
| 8,618,556 B2 | 12/2013 | Wu et al. | |
| 8,987,069 B1* | 3/2015 | Adam | H01L 29/161 117/105 |
| 2002/0125497 A1 | 9/2002 | Fitzgerald | H01L 21/02381 257/191 |
| 2002/0197803 A1* | 12/2002 | Leitz | H01L 21/82380 438/285 |
| 2005/0184316 A1* | 8/2005 | Kim | H01L 29/66795 257/213 |
| 2005/0274978 A1 | 12/2005 | Antoniadis | |
| 2007/0126035 A1* | 6/2007 | Ernst | H01L 29/42384 257/288 |
| 2007/0221956 A1 | 9/2007 | Inaba | |
| 2009/0227078 A1* | 9/2009 | Chen | H01L 21/82380 438/199 |
| 2010/0109044 A1 | 5/2010 | Tekleab et al. | |
| 2010/0301455 A1 | 12/2010 | Akiyama | |
| 2010/0308409 A1* | 12/2010 | Johnson | H01L 21/3086 257/368 |
| 2012/0138886 A1* | 6/2012 | Kuhn | B82Y 10/00 257/9 |
| 2012/0241818 A1 | 9/2012 | Kavalieros | |
| 2013/0244392 A1 | 9/2013 | Oh et al. | |
| 2014/0042492 A1 | 2/2014 | Tak et al. | |
| 2014/0252413 A1* | 9/2014 | Utomo | H01L 29/785 257/192 |
| 2014/0312432 A1* | 10/2014 | Ching | H01L 29/66795 257/401 |
| 2015/0263097 A1* | 9/2015 | Cheng | H01L 29/165 257/192 |
| 2015/0340500 A1* | 11/2015 | Brunco | H01L 21/76224 257/190 |

FOREIGN PATENT DOCUMENTS

| | | |
|---|---|---|
| KR | 2007-0101435 A | 10/2007 |
| KR | 10-2008-0062633 A | 7/2008 |
| KR | 10-2013-0007412 A | 1/2013 |
| KR | 10-2014-0021482 A | 2/2014 |

* cited by examiner

METHOD OF FABRICATING A SEMICONDUCTOR DEVICE

CROSS-REFERENCE TO RELATED APPLICATIONS

This U.S. non-provisional patent application claims priority under 35 U.S.C. §119 to Korean Patent Application No. 10-2014-0109653, filed on Aug. 22, 2014, in the Korean Intellectual Property Office, the entire contents of which are hereby incorporated by reference.

BACKGROUND

1. Field

Example embodiments of the inventive concepts relate to a method of fabricating a semiconductor device, and in particular, to a method of fabricating a highly-reliable semiconductor device.

2. Description of the Related Art

A semiconductor device may include integrated circuits (ICs) consisting of metal-oxide-semiconductor field-effect transistors (MOS-FETs). As a reduction in size and design rule of the semiconductor device is accelerated, the MOS-FETs are increasingly being scaled down. The reduction in size of the MOS-FET may lead to deterioration in operational properties of the semiconductor device. Accordingly, a variety of studies are conducted to overcome technical limitations associated with the scale-down of the semiconductor device and provide a relatively high performance semiconductor device.

SUMMARY

Example embodiments of the inventive concepts provide a method of fabricating a highly-reliable semiconductor device.

According to example embodiments of the inventive concepts, a method of fabricating a semiconductor device may include forming a preliminary channel layer on a substrate including a first region and a second region, forming a mask pattern on the first region of the substrate to cover the preliminary channel layer, etching the preliminary channel layer exposed by the mask pattern to form a first channel layer on the first region of the substrate, forming a second channel layer on the second region of the substrate, forming a first sacrificial layer on the second channel layer, performing a surface treatment process on the first sacrificial layer to form a buffer layer in an upper region of the first sacrificial layer, selectively removing the mask pattern and the buffer layer to expose top surfaces of the first sacrificial layer and the first channel layer, forming a hardmask pattern on the first channel layer and the first sacrificial layer, and etching the first and second channel layers using the hardmask pattern as an etch mask to form a first channel portion and a second channel portion. The buffer layer has a bottom surface that is coplanar with that of the mask pattern.

According to other example embodiments of the inventive concepts, a method of fabricating a semiconductor device includes forming a channel layer on a substrate, the channel layer including silicon germanium, forming a sacrificial layer on the channel layer, the sacrificial layer including silicon germanium having a germanium content higher than that of the channel layer, forming a hardmask pattern on the sacrificial layer, and performing a patterning process using the hardmask pattern as an etch mask to form a channel portion with an exposed top surface.

According to still other example embodiments of the inventive concepts, a method of fabricating a semiconductor device includes forming first and second epitaxial layers on respective first and second regions of a substrate, forming a first sacrificial layer on the first epitaxial layer and a second sacrificial layer on the second epitaxial layer, the first sacrificial layer having a germanium content higher than that of the first epitaxial layer and the second sacrificial layer having a germanium content lower than that of the second epitaxial layer, and etching the first and second sacrificial layers and the first and second epitaxial layers to form a first active fin and a second active fin.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1A through 12A are plan views illustrating a method of fabricating a semiconductor device according to example embodiments of the inventive concepts.

FIGS. 1B through 12B are sectional views illustrating a method of fabricating a semiconductor device according to example embodiments of the inventive concepts, taken along line I-I' of FIGS. 1A through 12A, respectively.

FIGS. 13A through 19A are plan views illustrating a method of fabricating a semiconductor device according to other example embodiments of the inventive concepts.

FIGS. 13B through 19B are sectional views illustrating a method of fabricating a semiconductor device according to other example embodiments of the inventive concepts, taken along line I-I' of FIGS. 13A through 19A, respectively.

FIGS. 20A through 28A are plan views illustrating a method of fabricating a semiconductor device according to still other example embodiments of the inventive concepts.

FIGS. 20B through 28B are sectional views illustrating a method of fabricating a semiconductor device according to still other example embodiments of the inventive concepts, taken along line I-I' of FIGS. 20A through 28A, respectively.

FIGS. 29A through 33A are plan views illustrating a method of fabricating a semiconductor device according to even other example embodiments of the inventive concepts.

FIGS. 29B through 33B are sectional views illustrating a method of fabricating a semiconductor device according to even other example embodiments of the inventive concepts, taken along line II-II' of FIGS. 29A through 33A, respectively.

Figure 1A:
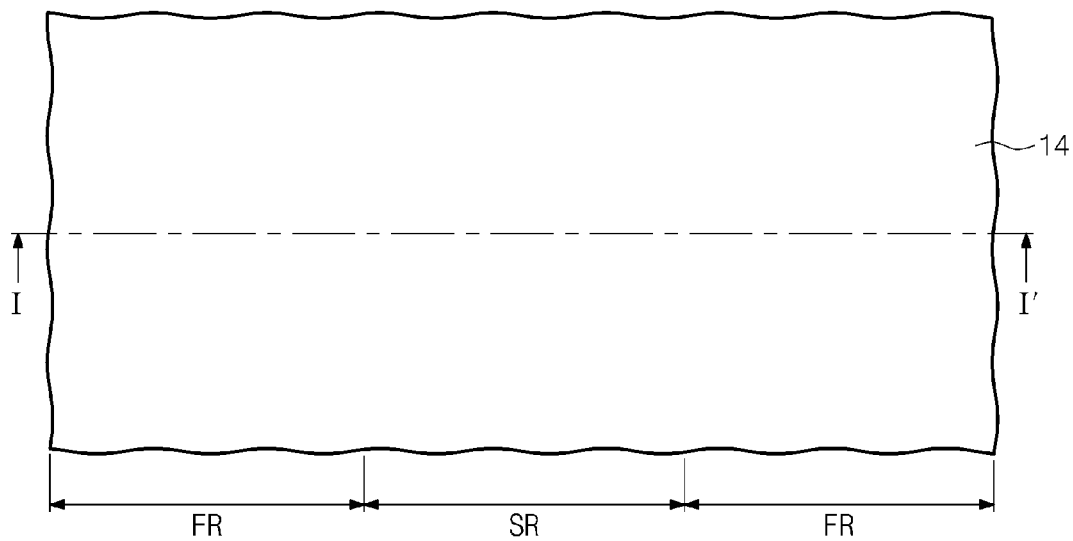

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 12A are plan views illustrating a method of fabricating a semiconductor device according to example embodiments of the inventive concepts. FIGS. 1B through 12B are sectional views illustrating a method of fabricating a semiconductor device according to example embodiments of the inventive concepts, taken along line I-I' of FIGS. 1A through 12A, respectively.

Figure 1B:
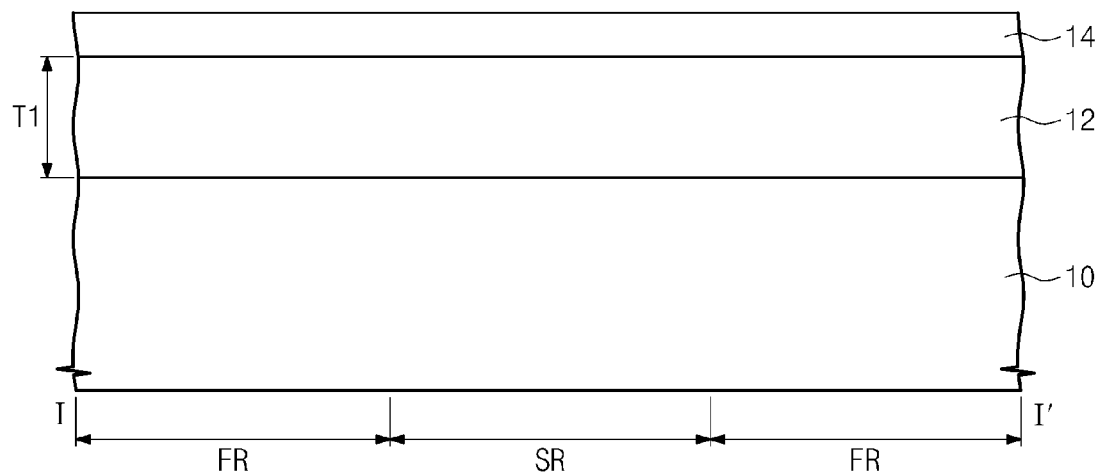

Referring to FIGS. 1A and 1B, a preliminary channel layer 12 may be formed on a substrate 10. The preliminary channel layer 12 may be formed by performing a deposition process or a selective epitaxial growth process on the substrate 10. The substrate 10 may be, for example, a silicon substrate or a silicon-germanium ($Si_{1-x}Ge_x$, $0 \le x < 1$) substrate. The substrate 10 may include first regions FR and a second region SR therebetween. The preliminary channel layer 12 may be a silicon layer or a silicon-germanium ($Si_{1-y}Ge_y$, $0 \le y < 1$) layer.

As an example, in the case where the substrate 10 is the silicon substrate, the preliminary channel layer 12 may be a silicon layer or a silicon-germanium ($Si_{1-y}Ge_y$, $0 \le y < 1$) layer. As an example, if a germanium content $Ge_x$ of the substrate 10 is zero, a germanium content $Ge_y$ of the preliminary channel layer 12 may be equal to or higher than zero (i.e., $x \le y$). As another example, if the substrate 10 is the silicon-germanium ($Si_{1-x}Ge_x$, $0 < x < 1$) substrate, the preliminary channel layer 12 may be a silicon-germanium ($Si_{1-y}Ge_y$, $0 \le y < 1$) layer, and the germanium content $Ge_x$ of the substrate 10 may be lower than the germanium content $Ge_y$ of the preliminary channel layer 12 (i.e., $x < y$).

The preliminary channel layer 12 may have a thickness of T1 (i.e., a distance between bottom and top surfaces of the preliminary channel layer 12), which is smaller than a critical thickness for preventing or reducing a lattice defect or a strained relaxation from occurring in silicon germanium lattices of the preliminary channel layer 12.

A sacrificial layer 14 may be formed on the preliminary channel layer 12. The sacrificial layer 14 may be formed by a selective epitaxial growth process. For example, the sacrificial layer 14 may be epitaxially grown using the preliminary channel layer 12 as a seed layer and concurrently using a germanium-containing gas as a process gas, and thus, the sacrificial layer 14 may be a layer of silicon germanium ($Si_{1-z}Ge_z$, $0 \le z < 1$). A germanium content $Ge_z$ of the sacrificial layer 14 may be greater than the germanium content $Ge_y$ of the preliminary channel layer 12 (i.e., $z > y$). The germanium content $Ge_z$ of the sacrificial layer 14 may be determined in consideration of a difference in germanium content between the substrate 10 and the preliminary channel layer 12 (e.g., $|Ge_x - Ge_y|$) and/or the thickness of the preliminary channel layer 12.

Figure 2A:
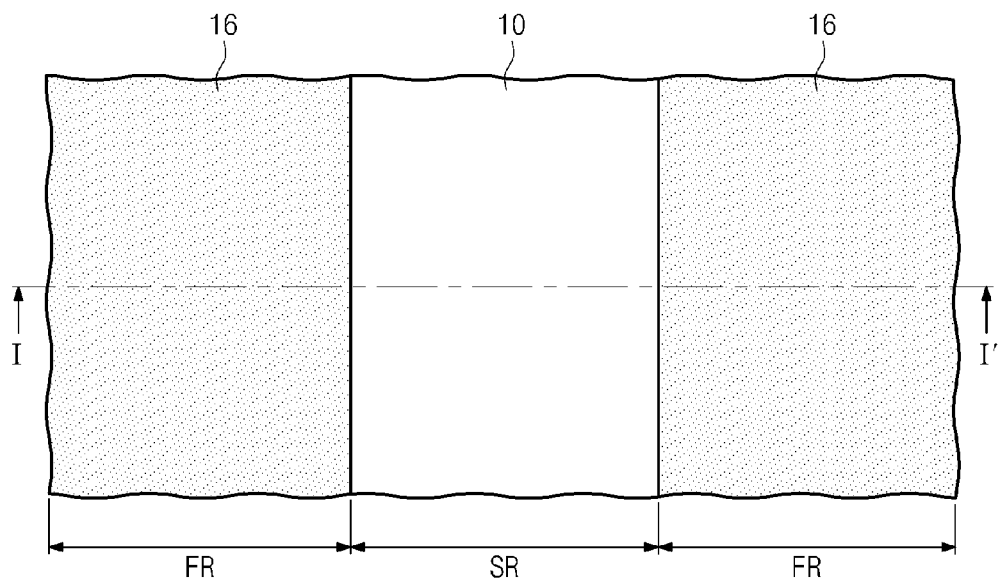
Figure 2B:
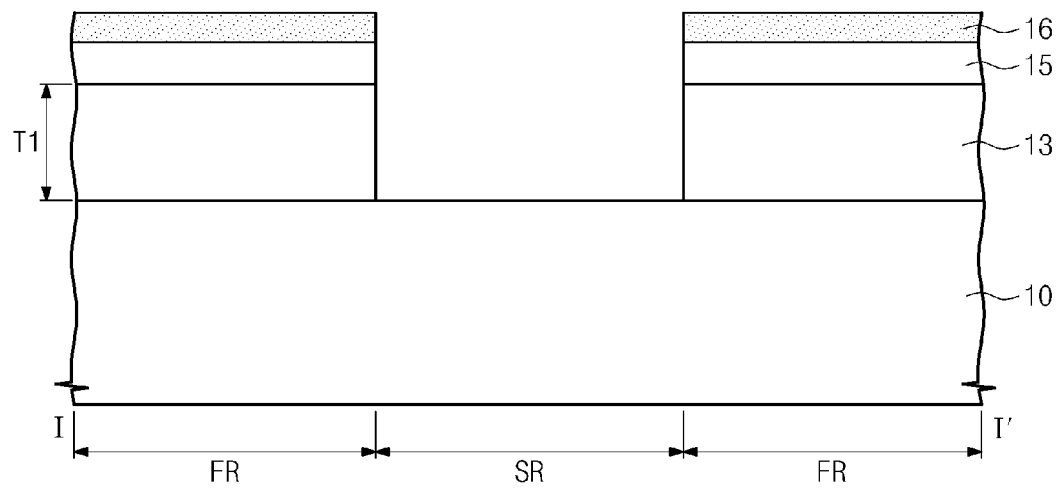

Referring to FIGS. 2A and 2B, a mask pattern 16 may be formed on the sacrificial layer 14. For example, the mask pattern 16 may be formed on the first regions FR of the substrate 10 to cover the sacrificial layer 14. The mask pattern 16 may include, for example, silicon nitride or silicon oxide.

The sacrificial layer 14 exposed by the mask pattern 16 and the preliminary channel layer 12 therebelow may be etched to form a first channel layer 13 and a first sacrificial layer 15 sequentially stacked on each of the first regions FR of the substrate 10. For example, a dry etching process may be performed to remove the sacrificial layer 14 and the preliminary channel layer 12 from the second region SR. Accordingly, a top surface of the substrate 10 may be exposed on the second region SR. Here, a thickness of the first channel layer 13 may be equal to the thickness T1 of the preliminary channel layer 12.

Figure 3A:
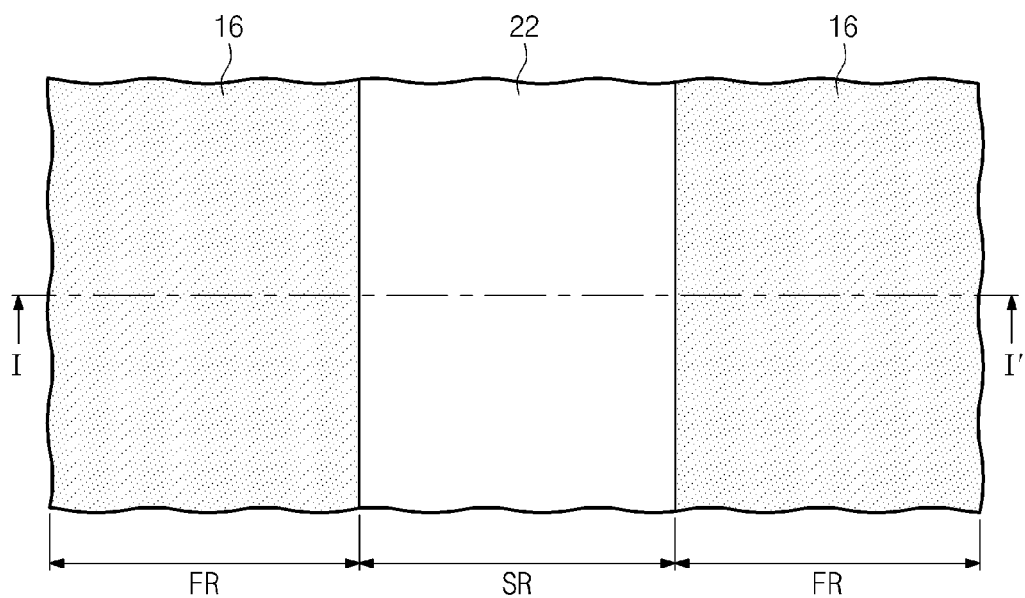
Figure 3B:
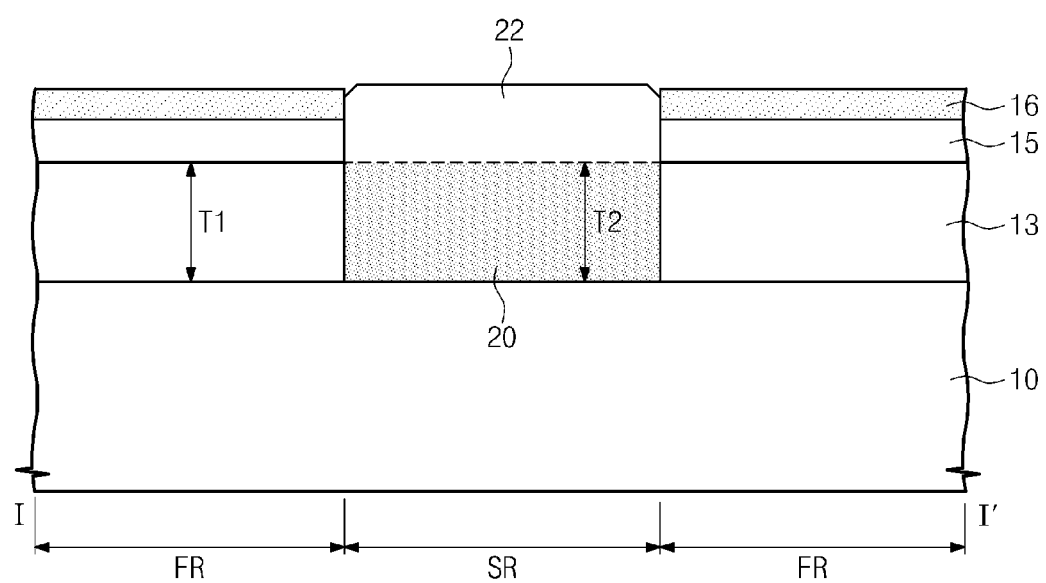

Referring to FIGS. 3A and 3B, a second channel layer 20 may be formed on the second region SR of the substrate 10. The second channel layer 20 may be formed by a selective epitaxial growth process. For example, the second channel layer 20 may be epitaxially grown using the substrate 10 and the first channel layer 13 as a seed layer and concurrently using a germanium-containing gas as a process gas, and thus, the second channel layer 20 may be a layer of silicon germanium. The second channel layer 20 may be formed to have a germanium content higher than that of the first channel layer 13. For example, the second channel layer 20 may be a compressively strained SiGe layer. The second channel layer 20 may have a thickness of T2 (i.e., a distance between bottom and top surfaces thereof), which may be substantially equal to the thickness T1 of the first channel layer 13. For example, the second channel layer 20 may be formed to have the top surface that is substantially coplanar with the top surface of the first channel layer 13.

A second sacrificial layer 22 may be formed on the second channel layer 20. In example embodiments, the second sacrificial layer 22 may be formed to have a top surface protruding from a top surface of the mask pattern 16. The second sacrificial layer 22 may be continuously formed on the second channel layer 20 by a selective epitaxial growth process using the second channel layer 20 as a seed layer, after the formation of the second channel layer 20. For example, the second sacrificial layer 22 may be epitaxially grown using the second channel layer 20 and the first sacrificial layer 15 as a seed layer and concurrently using a germanium-containing gas, in which a germanium concentration is lower than that of the Ge-containing gas for forming the second channel layer 20, as a process gas. Accordingly, the second sacrificial layer 22 may be a silicon-germanium (SiGe) layer, whose germanium content is lower than that of the second channel layer 20. The germanium content of the second sacrificial layer 22 may be substantially equal to or different from that of the first sacrificial layer 15.

Figure 4A:
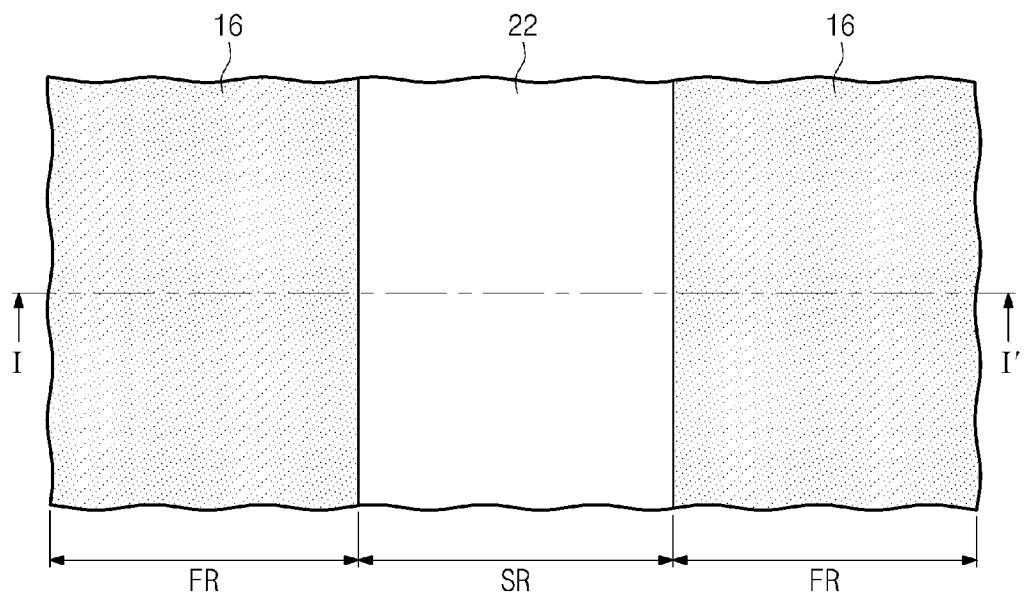
Figure 4B:
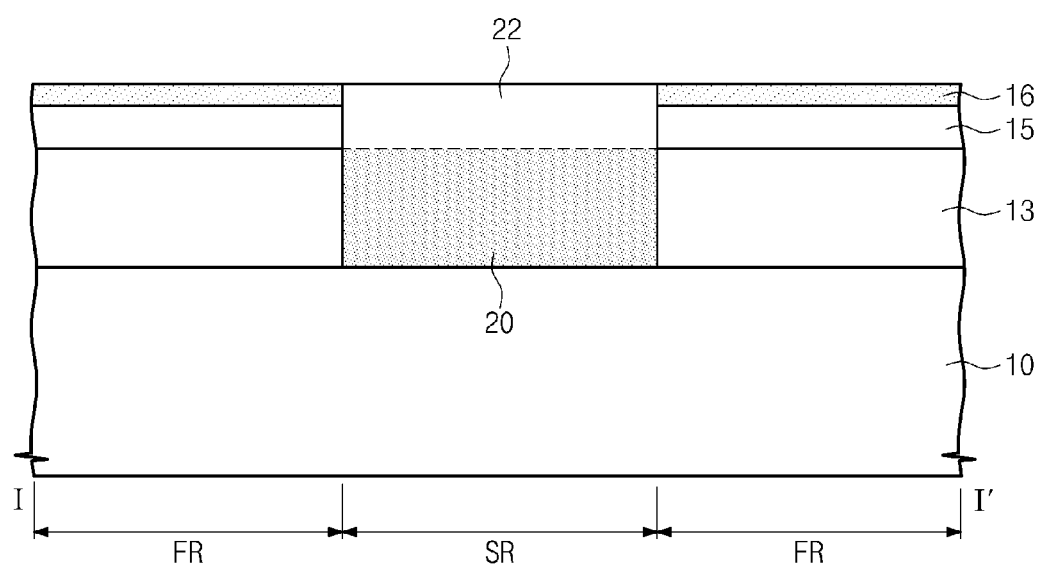

Referring to FIGS. 4A and 4B, a polishing process may be performed on the second sacrificial layer 22, and thus, the second sacrificial layer 22 may have a flat top surface. Further, the mask pattern 16 may be used as a polishing stop layer in the polishing process, and thus, the top surface of the second sacrificial layer 22 may become coplanar with that of the mask pattern 16. The polishing process on the second sacrificial layer 22 may be performed using, for example, a chemical mechanical polishing technique.

Figure 5A:
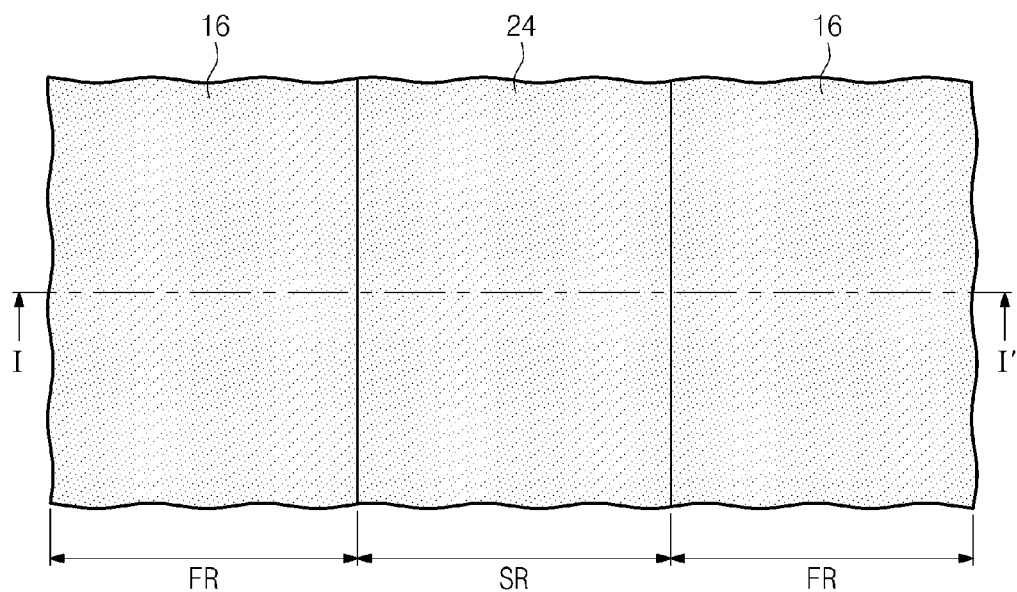
Figure 5B:
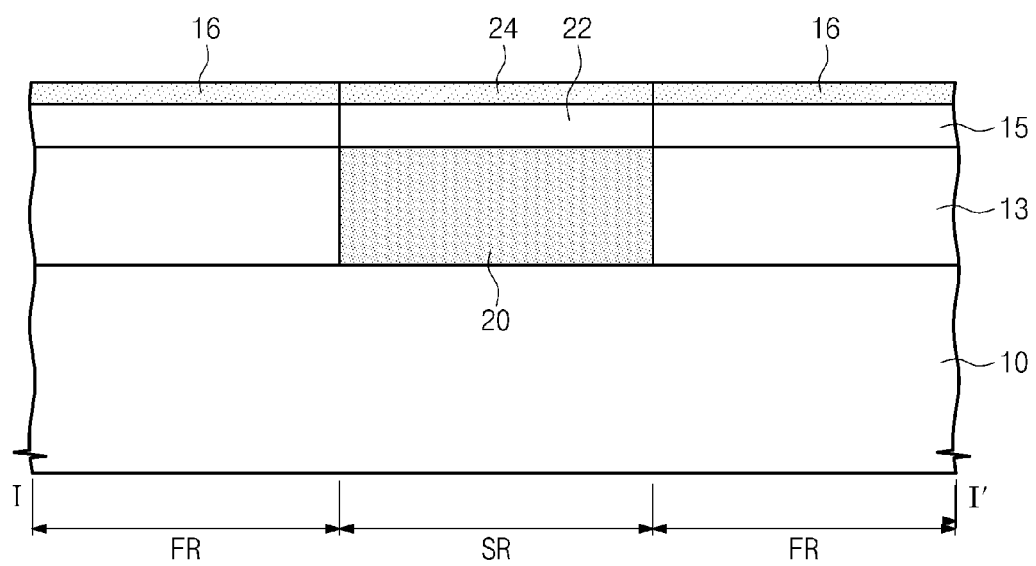

Referring to FIGS. 5A and 5B, a buffer layer 24 may be formed in an upper region of the second sacrificial layer 22. The buffer layer 24 may be formed by selectively performing a surface treatment process (e.g., an oxidation or nitridation process) on the upper region of the second sacrificial layer 22. The buffer layer 24 may be formed of substantially the same material as that of the mask pattern 16. For example, in the case where the mask pattern 16 is a silicon oxide layer, the buffer layer 24 may be formed of silicon oxide, and in the case where the mask pattern 16 is a silicon nitride layer, the buffer layer 24 may be formed of silicon nitride. The surface treatment process may be performed at a lower temperature, capable of preventing or reducing a deformation of the strained state of the first and second channel layers 13 and 20 and more easily controlling the thickness of the buffer layer 24. In example embodiments, the surface treatment process may be performed using an oxidation process, such as an $O_2$-ion implantation process or a plasma oxidation process. In other embodiments, the surface treatment process may be performed using a nitridation process, such as a plasma nitridation process. The surface treatment process may be performed in such a way that the second sacrificial layer 22 has substantially the same thickness as the first sacrificial layer 15.

By forming the buffer layer 24, reducing a difference in height between the first and second sacrificial layers 15 and 22 may be possible. In the case where there is a big height difference between the first and second sacrificial layers 15 and 22, there may be a difficulty in subsequent processes (e.g., photolithography and etching processes) for forming a fin pattern.

In some embodiments, the second sacrificial layer 22 may be thicker than the first sacrificial layer 15. As described above, the buffer layer 24 may correspond to the upper portion of the second sacrificial layer 22, to which the surface treatment process is performed, and thus, there is a difficulty in forming the second sacrificial layer 22, whose thickness is the same as that of the first sacrificial layer 15, or in forming the buffer layer 24, whose bottom surface is coplanar with the top surface of the first sacrificial layer 15. However, the second sacrificial layer 22 may be formed in such a way that a difference in thickness between the first and second sacrificial layers 15 and 22 does not lead to a difficulty in the subsequent process.

Figure 6A:
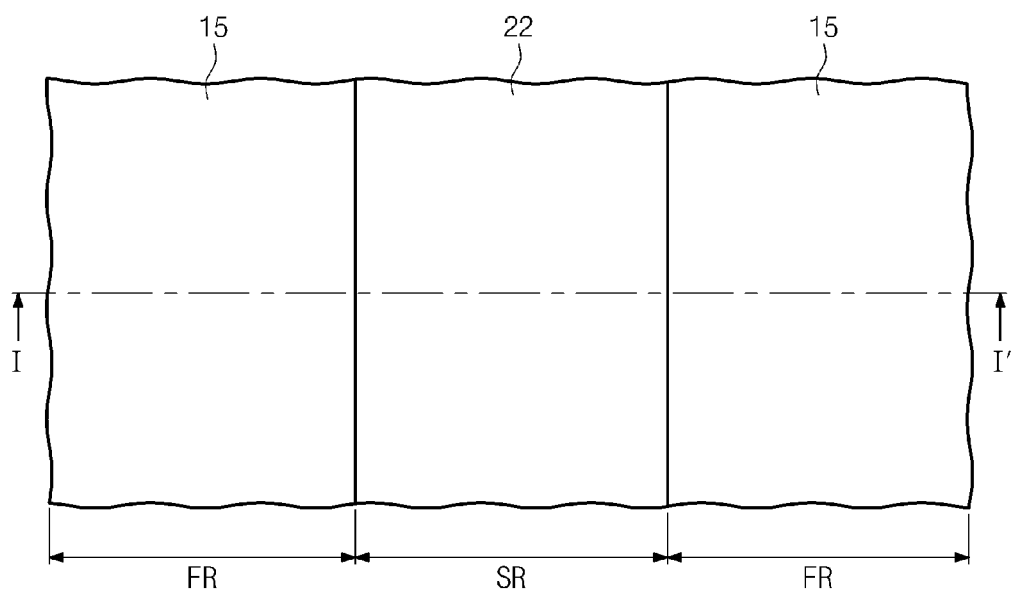
Figure 6B:
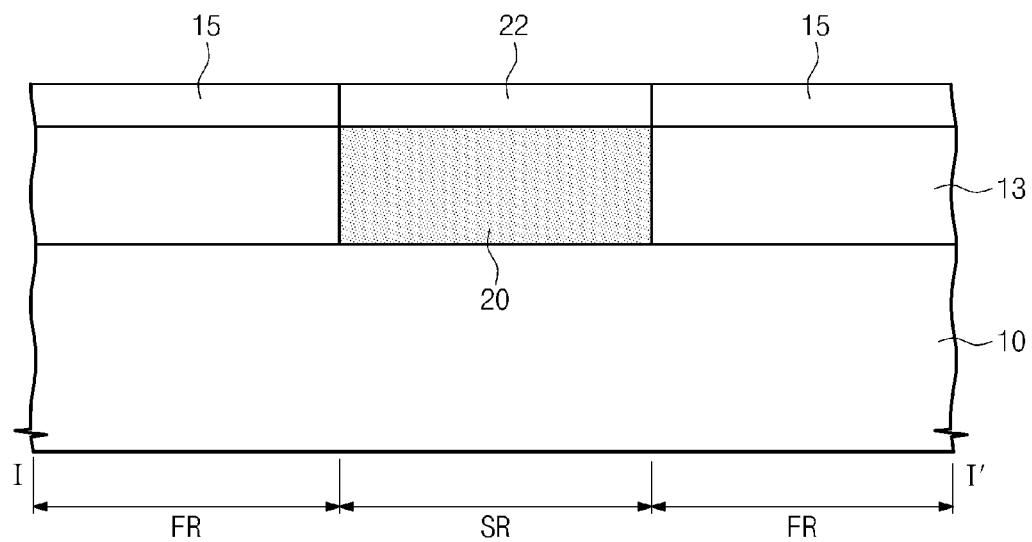

Referring to FIGS. 6A and 6B, the buffer layer 24 and the mask pattern 16 may be removed to expose the top surfaces of the first and second sacrificial layers 15 and 22. The buffer layer 24 and the mask pattern 16 may include substantially the same material, and thus, they can be simultaneously removed by a single process. In the case where the buffer layer 24 and the mask pattern 16 are formed of silicon oxide, they may be removed by a wet etching process using, for example, a hydrogen fluoride (HF) solution. In the case where the buffer layer 24 and the mask pattern 16 are formed of silicon nitride, they may be removed by a wet etching process using, for example, a phosphoric acid ($H_3PO_4$) solution.

Figure 7A:
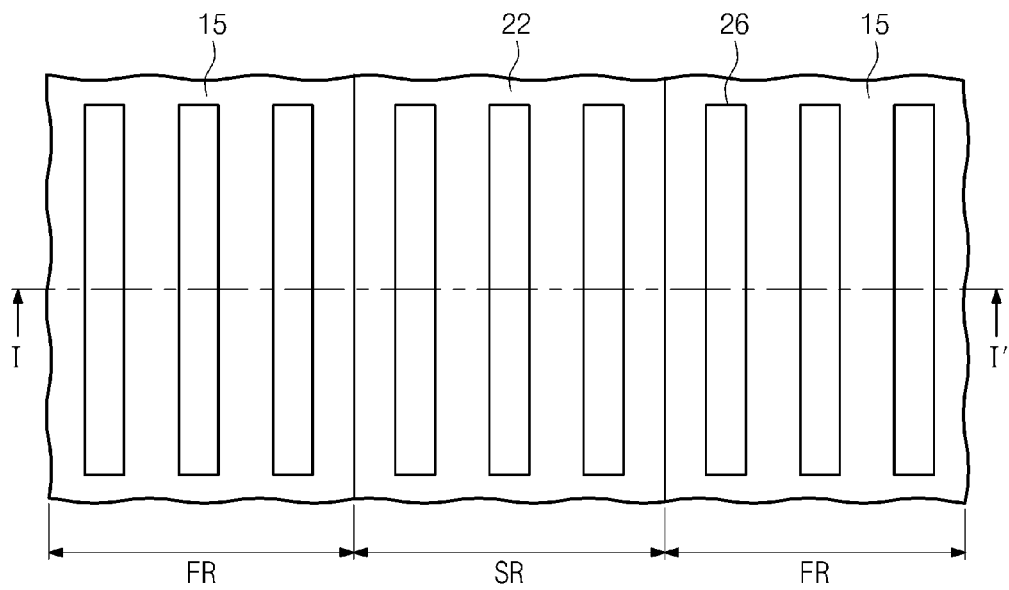
Figure 7B:
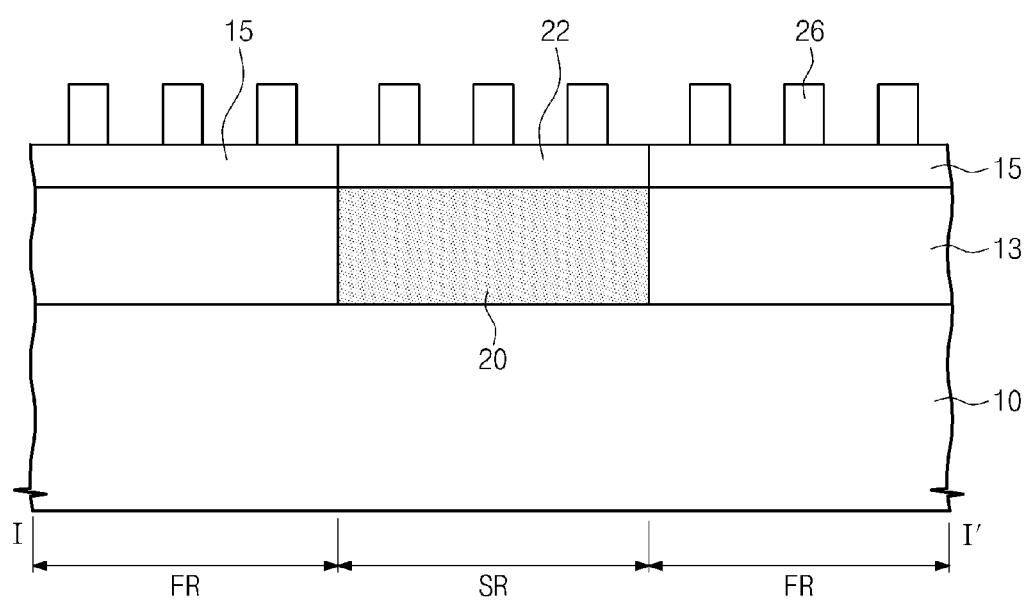

Referring to FIGS. 7A and 7B, a hardmask pattern 26 may be formed on the first and second sacrificial layers 15 and 22. The hardmask pattern 26 may be formed of a material (e.g., silicon nitride) having an etch selectivity with respect to the first and second sacrificial layers 15 and 22. The formation of the hardmask pattern 26 may include forming a sacrificial pattern (not shown), conformally forming an insulating layer (not shown) on the first and second sacrificial layers 15 and 22 to cover the sacrificial pattern, performing an etch-back process on the insulating layer to form a spacer which serves as the hardmask pattern 26 on sidewalls of the sacrificial pattern, removing the sacrificial pattern, and trimming end portions of the spacer.

Figure 8A:
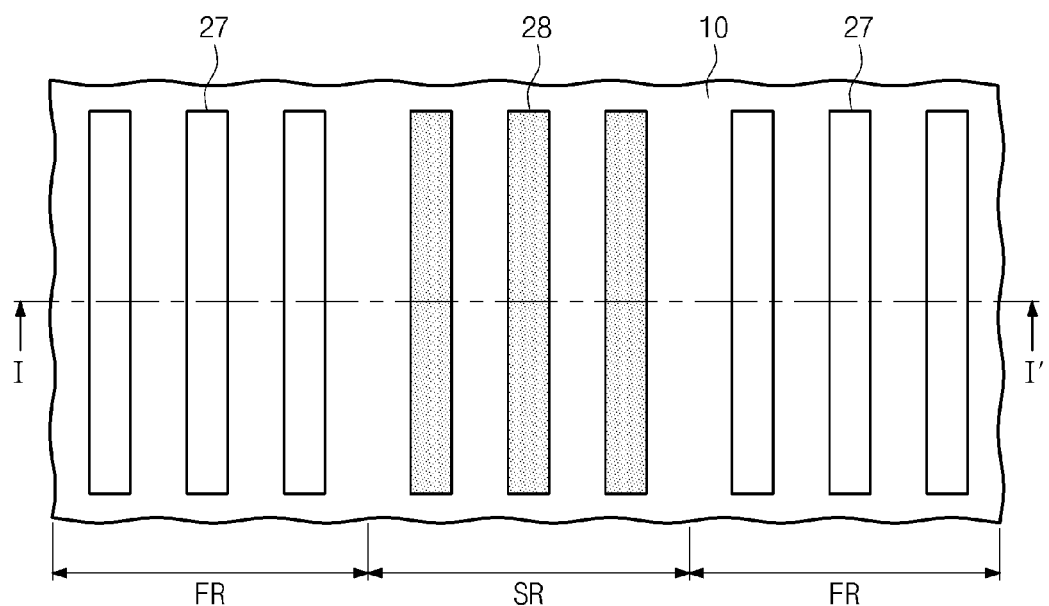
Figure 8B:
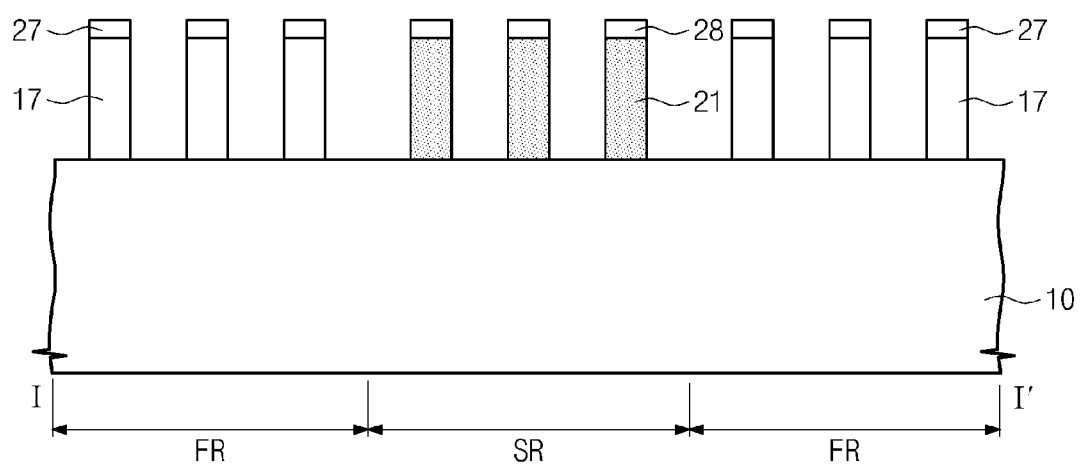

Referring to FIGS. 8A and 8B, the first and second sacrificial layers 15 and 22 may be patterned using the hardmask pattern 26 as an etch mask to form a first sacrificial pattern 27 and a second sacrificial pattern 28. The first and second channel layers 13 and 20 exposed by the first and second sacrificial patterns 27 and 28 may be patterned to form a first channel portion 17 and a second channel portion 21. During the patterning of the first and second sacrificial layers 15 and 22 and the first and second channel layers 13 and 20, the hardmask pattern 26 may be removed, and thus, the first and second sacrificial patterns 27 and 28 may be exposed.

Figure 9A:
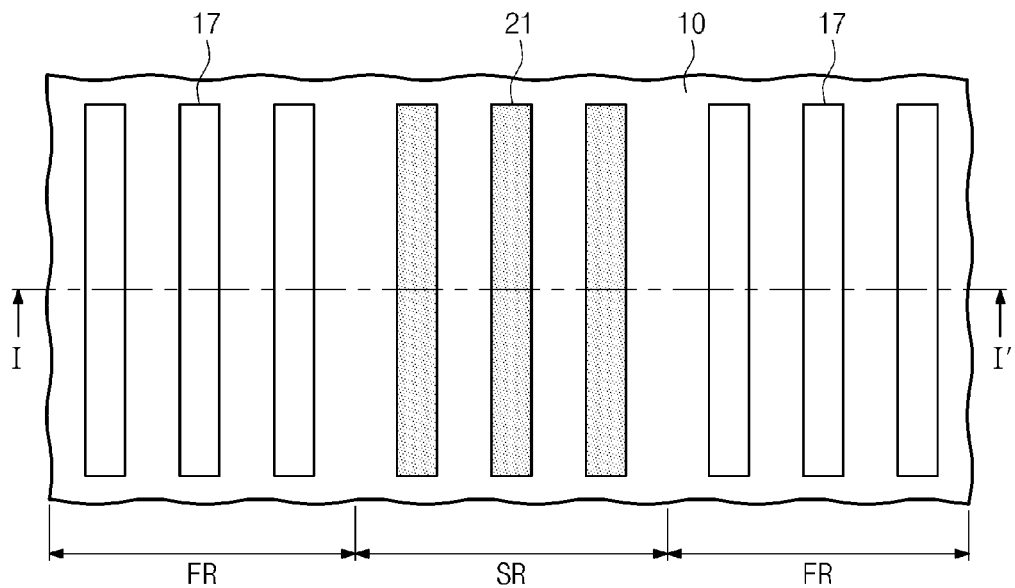
Figure 9B:
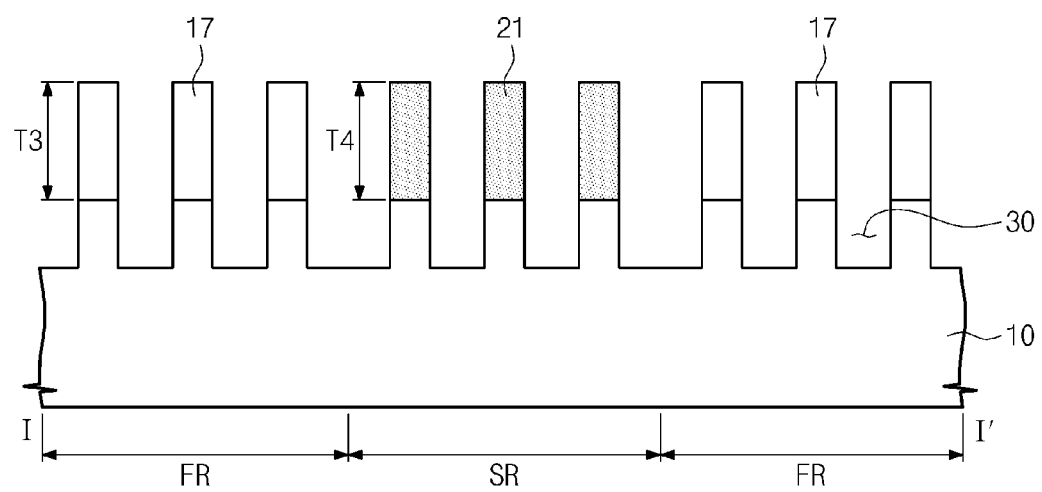

Referring to FIGS. 9A and 9B, the substrate 10 may be partially etched. In other words, the top surface of the substrate 10 may be partially recessed. Accordingly, a recess region 30 may be formed in an upper portion of the substrate 10 and between each pair of the first and second channel portions 17 and 21.

The first and second sacrificial patterns 27 and 28 may be used as an etch mask, in the processes of patterning the first and second channel layers 13 and 20 and/or recessing the top surface of the substrate 10. Since the hardmask pattern 26 is removed during the patterning process and the first and second sacrificial patterns 27 and 28 are formed of substantially the same material as the first and second channel portions 17 and 21 and the substrate 10, not only the first and second channel portions 17 and 21 and the substrate 10 but also the first and second sacrificial patterns 27 and 28 may be etched, without any etch selectivity (e.g., at the same etch rate), in the pattering and recessing processes. For example, the first and second sacrificial patterns 27 and 28 may be completely removed to expose the top surfaces of the first and second channel portions 17 and 21.

The first and second channel portions 17 and 21 may have thicknesses of T3 and T4 (i.e., distances between bottom and top surfaces thereof), which may be substantially equal to the thicknesses T1 and T2 of the first and second channel layers 13 and 20. For example, the top surfaces of the first and second channel portions 17 and 21 may be positioned at the same level as those of the first and second channel layers 13 and 20, respectively. Forming the recess region 30 and the first and second channel portions 17 and 21 may include etching the substrate 10 and the first and second channel layers 13 and 20 using an anisotropic dry etching process or an anisotropic wet etching process.

Meanwhile, when the first and second channel layers 13 and 20 without the first and second sacrificial layers 15 and 22 thereon are patterned to form the first and second channel portions 17 and 21, upper portions of the first and second channel portions 17 and 21 may be unintentionally etched, and this may make it difficult to form an active fin with a desired height. However, according to example embodiments of the inventive concepts, the first and second sacrificial patterns 27 and 28, instead of the first and second channel portions 17 and 21, may be etched in the process of patterning the first and second channel layers 13 and 20, and thus, it is possible to prevent or reduce the active fin from having a reduced height.

Figure 10A:
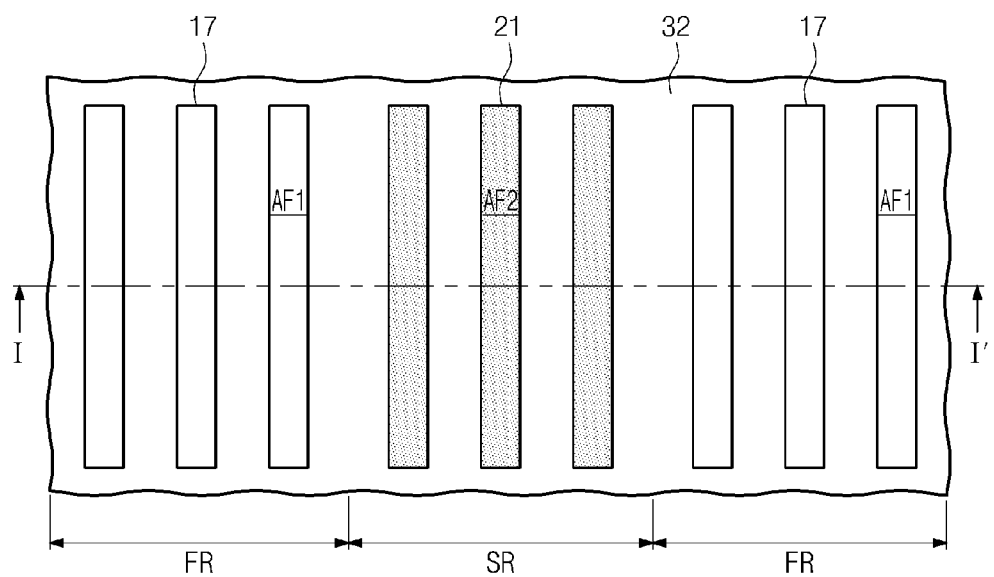
Figure 10B:
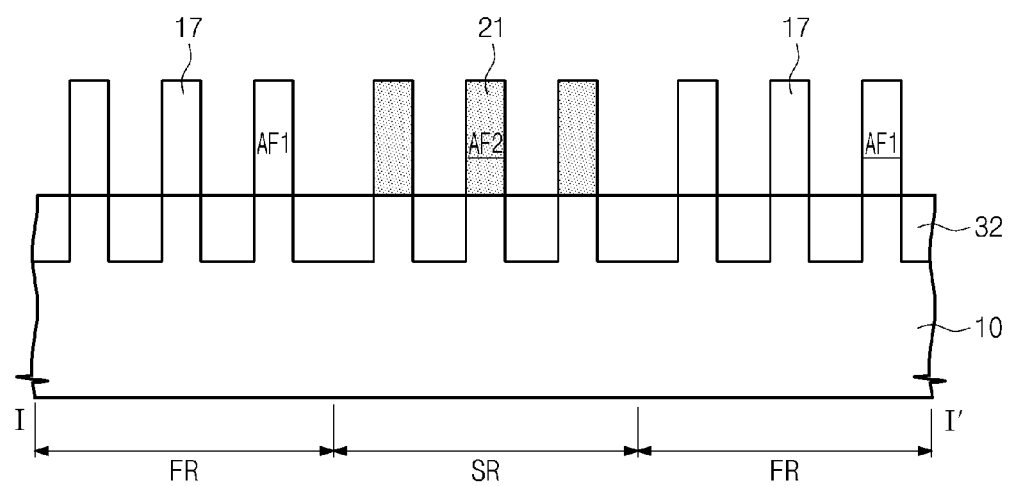

Referring to FIGS. 10A and 10B, a device isolation layer 32 may be formed on the substrate 10 to fill the recess region 30. The formation of the device isolation layer 32 may include forming an insulating layer (e.g., of silicon oxide) on the substrate 10 to fill the recess region 30 and cover the top surfaces of the first and second channel portions 17 and 21, polishing the insulating layer to expose the first and second channel portions 17 and 21, and vertically recessing the insulating layer using an etching process. As a result of the vertical recessing of the insulating layer, each of the first and second channel portions 17 and 21 may have a structure protruding upward from the device isolation layer 32. For example, the first and second channel portions 17 and 21 may have side surfaces that are exposed above the device isolation layer.

As a result of the formation of the device isolation layer 32, the first channel portion 17 formed on the second region SR of the substrate 10 may be used as a first active fin AF1, and the second channel portion 21 formed on the second region SR of the substrate 10 may be used as a second active fin AF2.

Figure 11A:
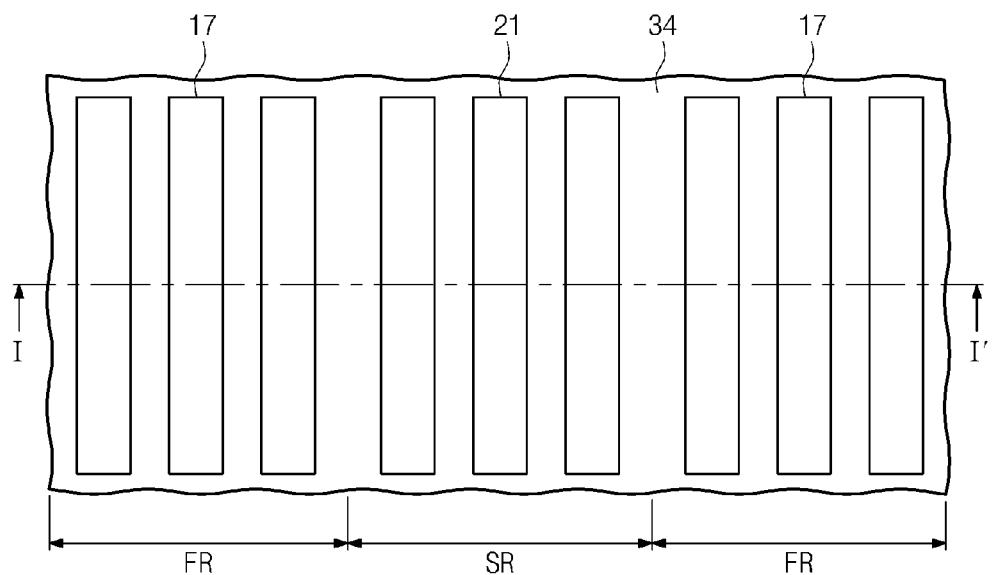
Figure 11B:
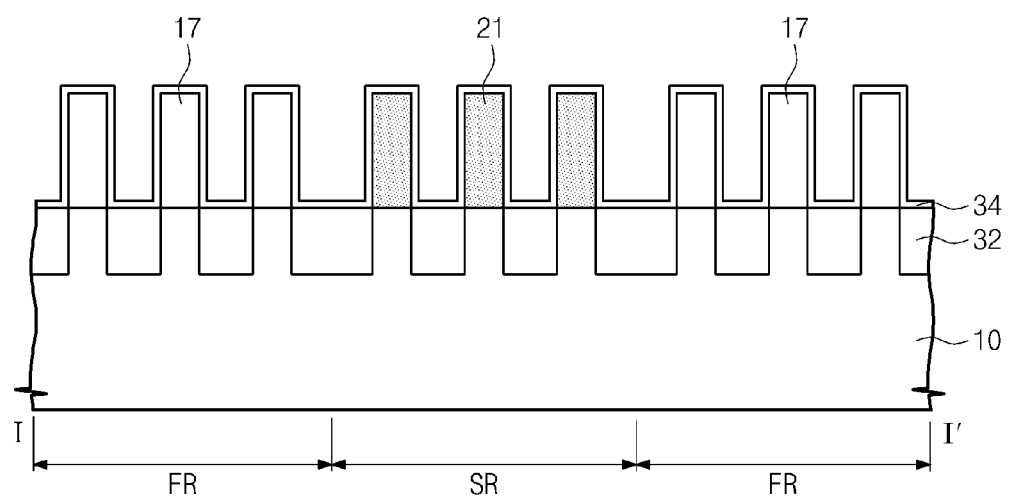

Referring to FIGS. 11A and 11B, a gate insulating layer 34 may be formed on the substrate 10. For example, the gate insulating layer 34 may be formed to conformally cover a top surface of the device isolation layer 32 and the exposed surfaces of the first and second channel portions 17 and 21. The gate insulating layer 34 may be formed of at least one of a silicon oxide layer or a dielectric material, whose dielectric constant is higher than that of the silicon oxide layer.

Figure 12A:
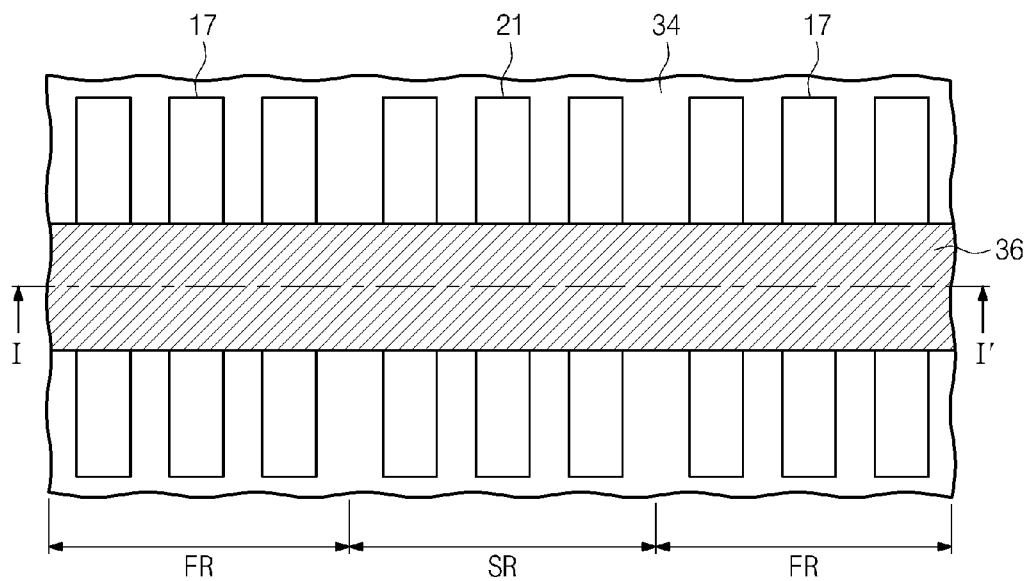
Figure 12B:
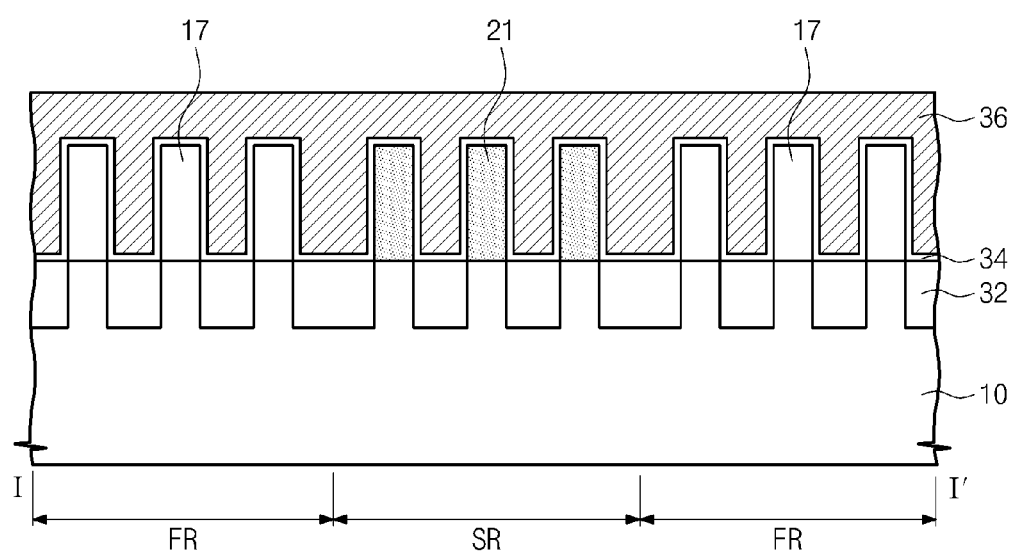

Referring to FIGS. 12A and 12B, a gate electrode 36 may be formed on the substrate 10 to cross at least one of the first and second active fins AF1 and AF2. The formation of the gate electrode 36 may include forming a gate electrode layer (not shown) on the substrate 10 to cover the first and second active fins AF1 and AF2, and patterning the gate electrode layer. The gate electrode 36 may be formed to cover the gate insulating layer 34. The gate electrode 36 may be formed of, for example, at least one of poly silicon or metallic materials. Source/drain regions (not shown) may be formed in the substrate 10 exposed by the gate electrode 36.

FIGS. 13A through 19A are plan views illustrating a method of fabricating a semiconductor device according to other example embodiments of the inventive concepts. FIGS. 13B through 19B are sectional views illustrating a method of fabricating a semiconductor device according to other example embodiments of the inventive concepts, taken along line I-I' of FIGS. 13A through 19A, respectively. For concise description, a previously described element may be identified by a similar or identical reference number without repeating an overlapping description thereof.

Figure 13A:
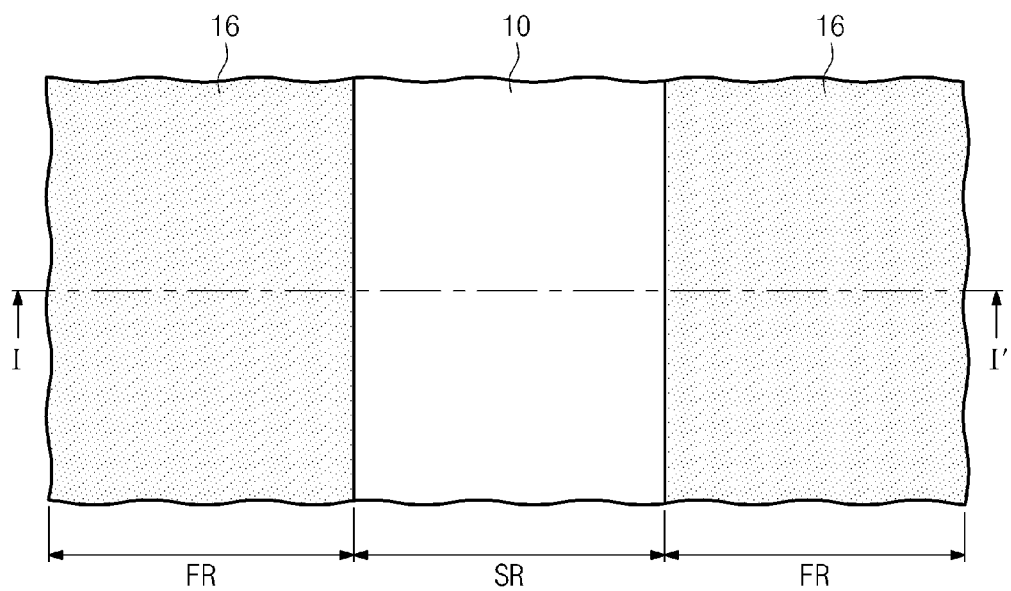
Figure 13B:
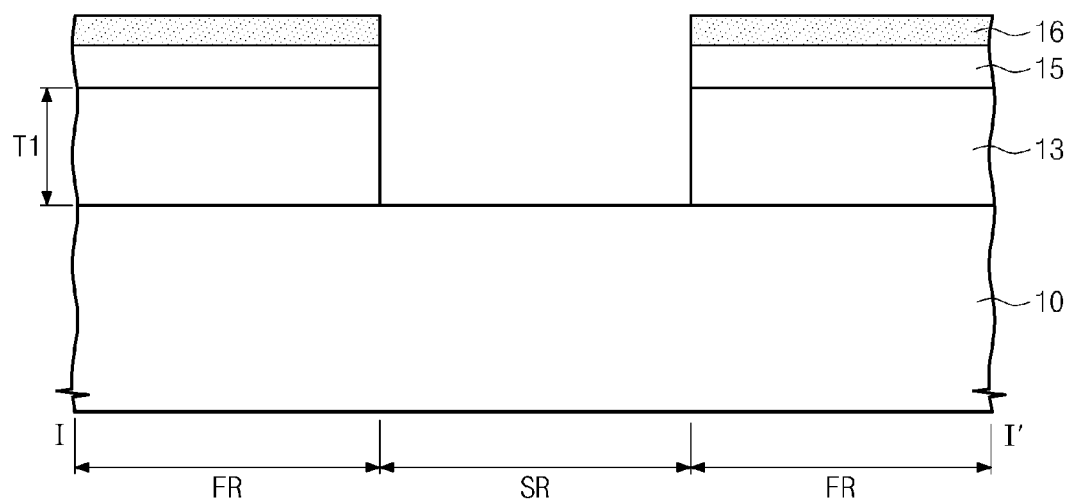

Referring to FIGS. 13A and 13B, the first channel layer 13 and the first sacrificial layer 15 may be sequentially formed on the first regions FR of the substrate 10. The substrate 10 may be, for example, a silicon substrate or a silicon-germanium ($Si_{1-x}Ge_x$, $0 \leq x < 1$) substrate. The first channel layer 13 may be a silicon layer or a silicon-germanium ($Si_{1-y}Ge_y$, $0 \leq y < 1$) layer.

As an example, in the case where the substrate 10 is the silicon substrate, the first channel layer 13 may be a silicon layer or a silicon-germanium ($Si_{1-y}Ge_y$, $0 \leq y < 1$) layer. For example, if a germanium content $Ge_x$ of the substrate 10 is zero, a germanium content $Ge_y$ of the first channel layer 13 may be equal to or higher than zero (i.e., $x \leq y$). As another example, if the substrate 10 is the silicon-germanium ($Si_{1-x}Ge_x$, $0 < x < 1$) substrate, the first channel layer 13 may be a silicon-germanium layer, and the germanium content $Ge_x$ of the substrate 10 may be lower than the germanium content $Ge_y$ of the first channel layer 13 (i.e., $x < y$).

The first channel layer 13 may be formed to have a thickness T1. The mask pattern 16 may be formed on the first channel layer 13. The first channel layer 13 may be formed on the first region FR by a patterning process. The top surface of the substrate 10 may be exposed on the second region SR.

Figure 14A:
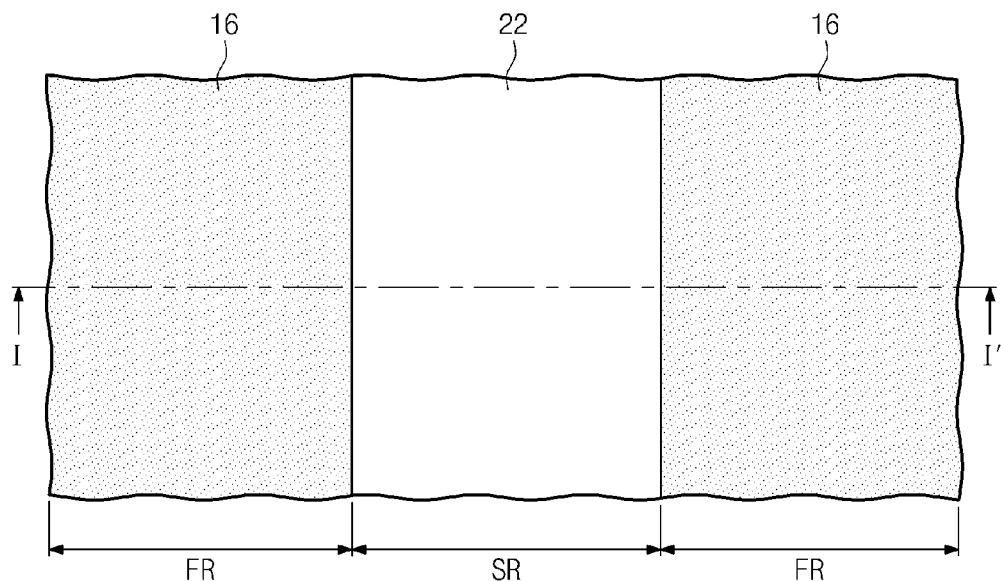
Figure 14B:
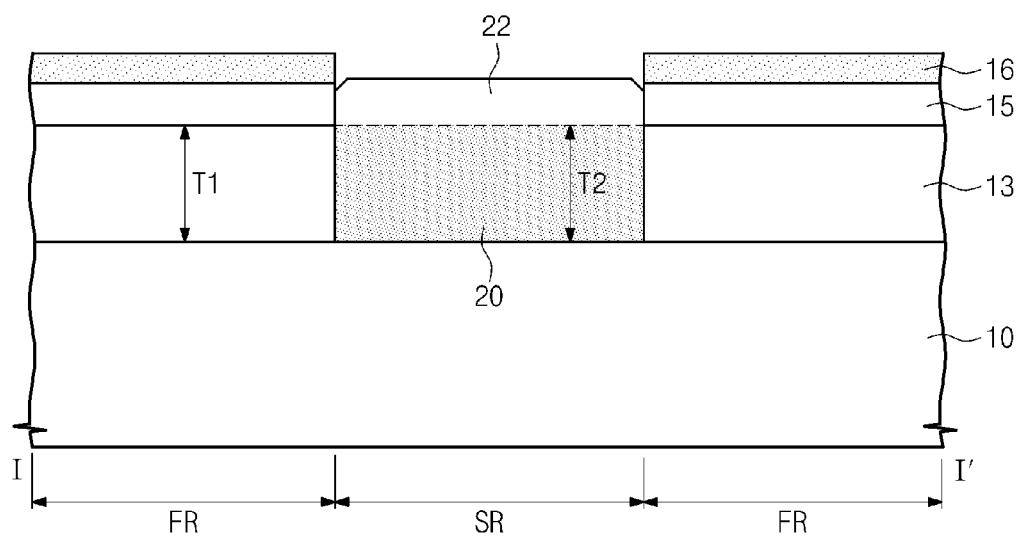

Referring to FIGS. 14A and 14B, the second channel layer 20 may be formed on the second region SR of the substrate 10. The second channel layer 20 may be formed to have a Ge content higher than that of the first channel layer 13. The second channel layer 20 may have a thickness T2, which may be substantially equal to the thickness T1 of the first channel layer 13. For example, the second channel layer 20 may be formed to have the top surface that is substantially coplanar with the top surface of the first channel layer 13. The second channel layer 20 may be formed by a selective epitaxial growth process.

The second sacrificial layer 22 may be formed on the second channel layer 20. The second sacrificial layer 22 may be formed to have a top surface that is substantially coplanar with the top surface of the first sacrificial layer 15. The second sacrificial layer 22 may be formed using a selective epitaxial growth process.

Figure 15A:
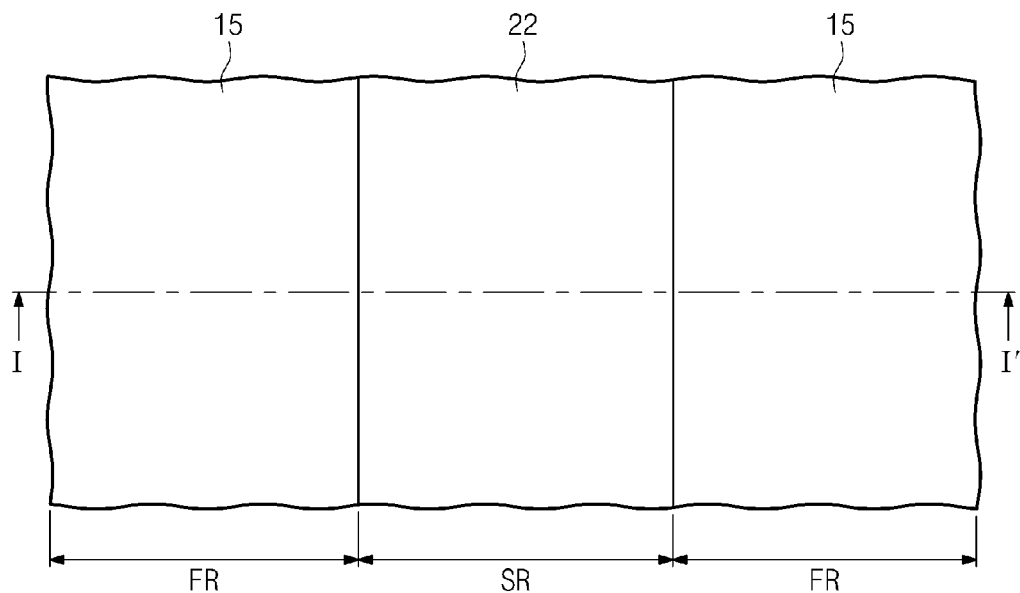
Figure 15B:
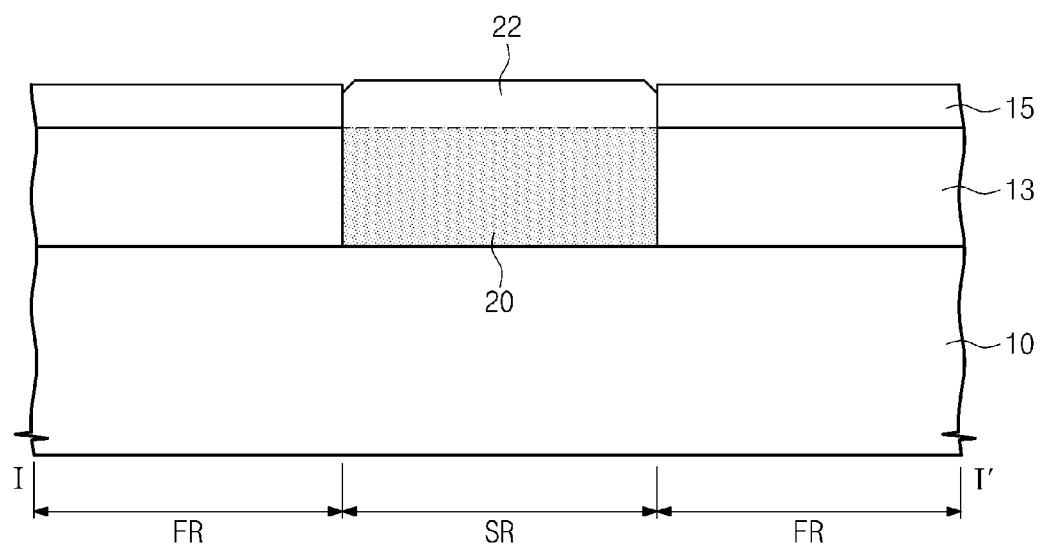
Figure 16A:
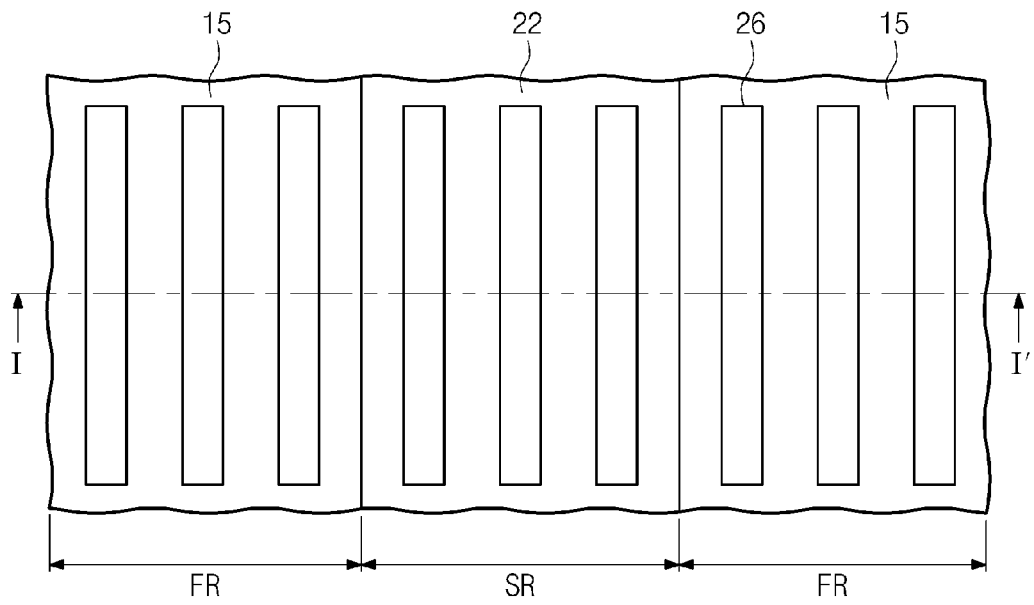
Figure 16B:
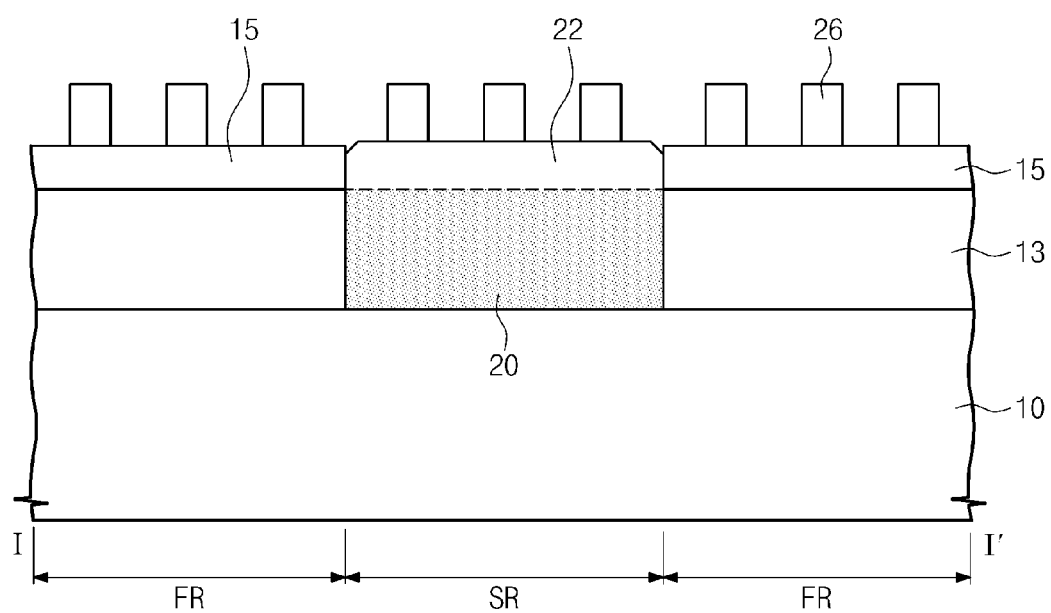
Figure 17A:
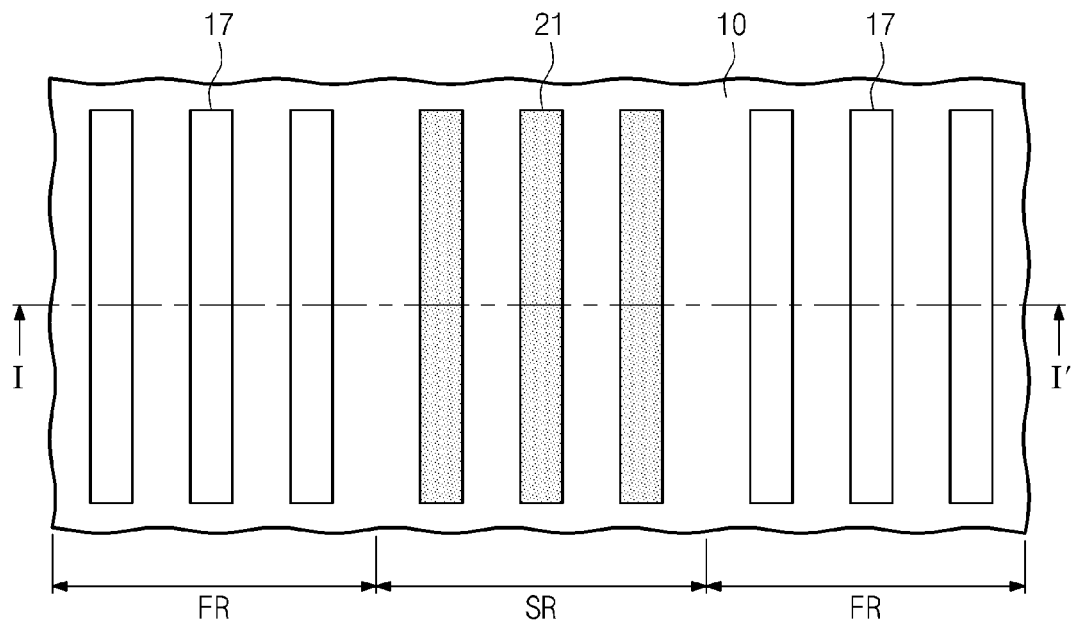
Figure 17B:
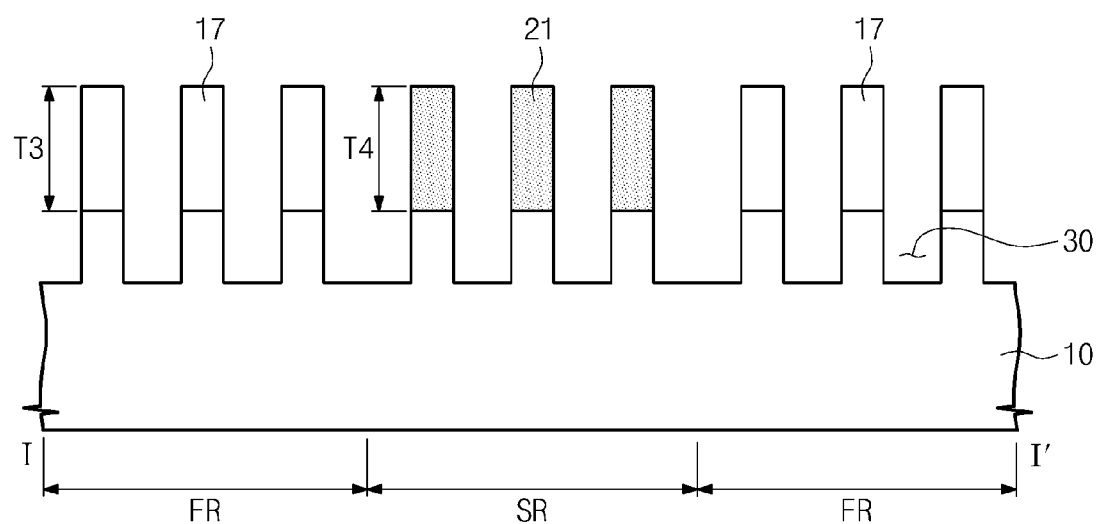
Figure 18A:
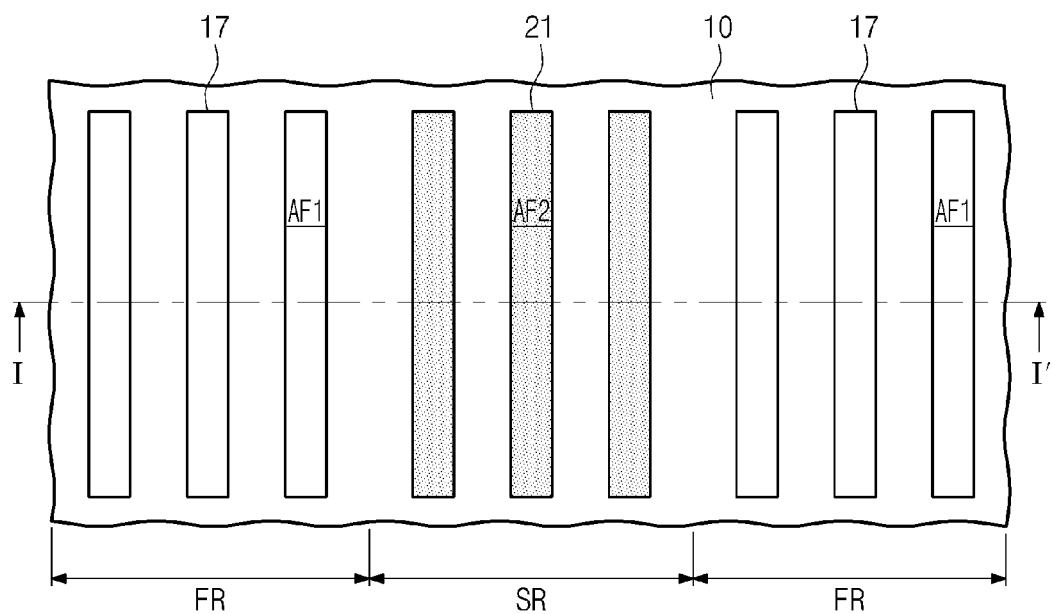
Figure 18B:
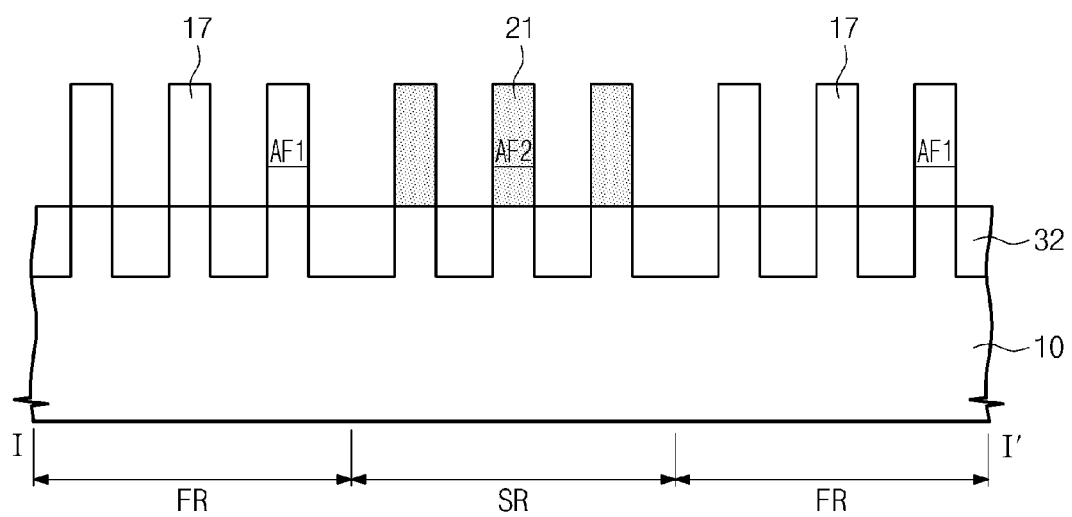
Figure 19A:
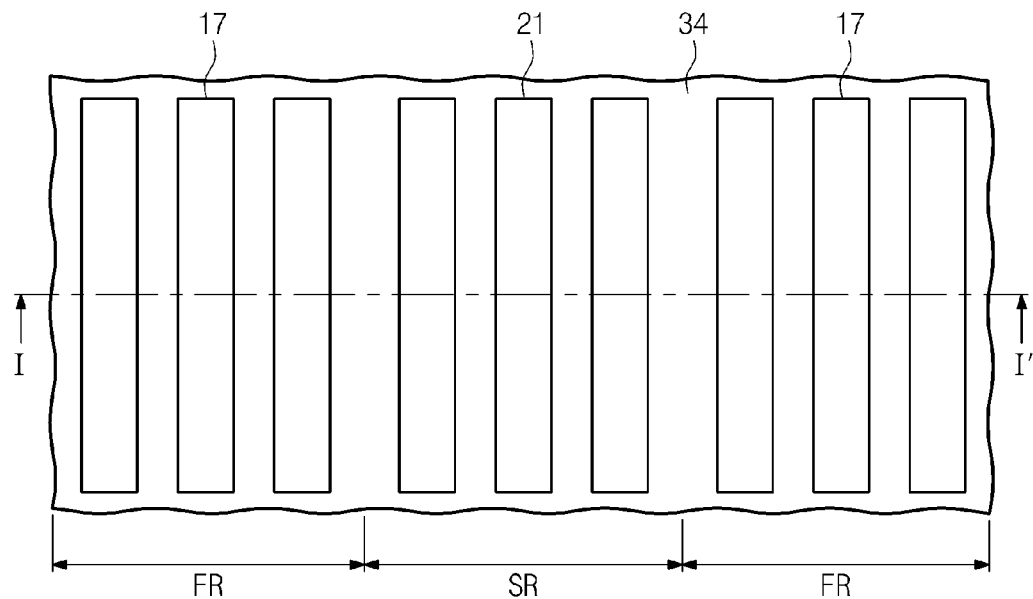
Figure 19B:
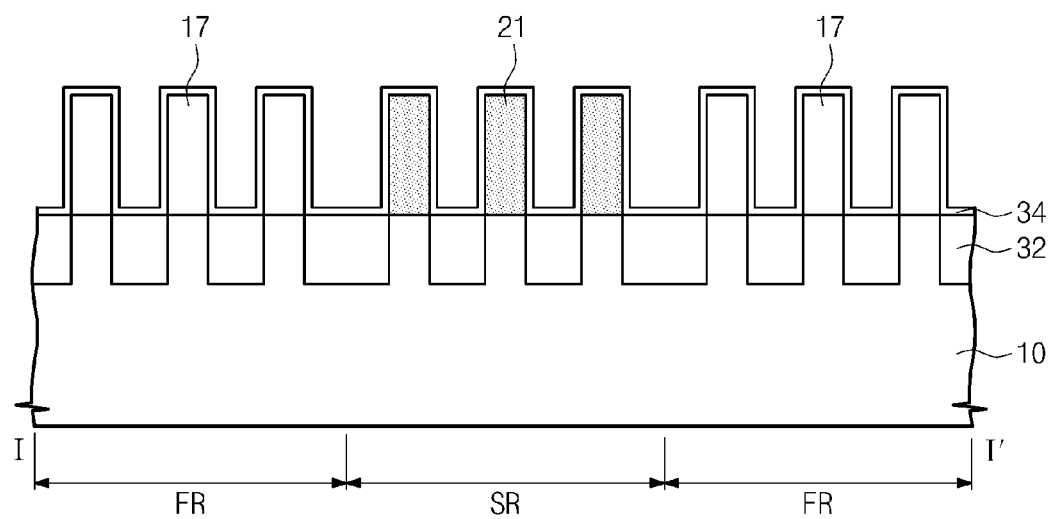

Referring to FIGS. 15A and 15B, the mask pattern 16 may be removed to expose the top surface of the first sacrificial layer 15.

Referring to FIGS. 16A, 16B, 17A, and 17B, the hardmask pattern 26 may be formed on the first and second sacrificial layers 15 and 22. Thereafter, the first and second sacrificial layers 15 and 22 and the first and second channel layers 13 and 20 may be patterned using the hardmask pattern 26 as an etch mask to form the first and second channel portions 17 and 21 on the first and second regions FR and SR, respectively, of the substrate 10. Further, the top surface of the substrate 10 may be etched to form the recess region 30 in the substrate 10. The hardmask pattern 26 and the first and second sacrificial layers 15 and 22 may be removed in the patterning process for forming the first and second channel portions 17 and 21. Accordingly, the first and second channel portions 17 and 21 may have the thicknesses T3 and T4 that are substantially equal to the thicknesses T1 and T2 of the first and second channel layers 13 and 20, respectively, or have the top surfaces that are formed at substantially the same level as those of the first and second channel layers 13 and 20.

Referring to FIGS. 18A, 18B, 19A, and 19B, the device isolation layer 32 may be formed to fill the recess region 30 of the substrate 10. The device isolation layer 32 may define the first active fin AF1 and the second active fin AF2. Thereafter, the gate insulating layer 34 may be formed on the substrate 10 to conformally cover the top surface of the device isolation layer 32 and exposed surfaces of the first and second active fins AF1 and AF2.

Referring back to FIGS. 12A and 12B, the gate electrode 36 may be formed on the gate insulating layer 34 to cross at least one of the first and second active fins AF1 and AF2. Source/drain regions (not shown) may be formed in the substrate 10 exposed by the gate electrode 36.

FIGS. 20A through 28A are plan views illustrating a method of fabricating a semiconductor device according to still other example embodiments of the inventive concepts. FIGS. 20B through 28B are sectional views illustrating a method of fabricating a semiconductor device according to still other example embodiments of the inventive concepts, taken along line I-I' of FIGS. 20A through 28A, respectively. For concise description, a previously described element may be identified by a similar or identical reference number without repeating an overlapping description thereof.

Figure 20A:
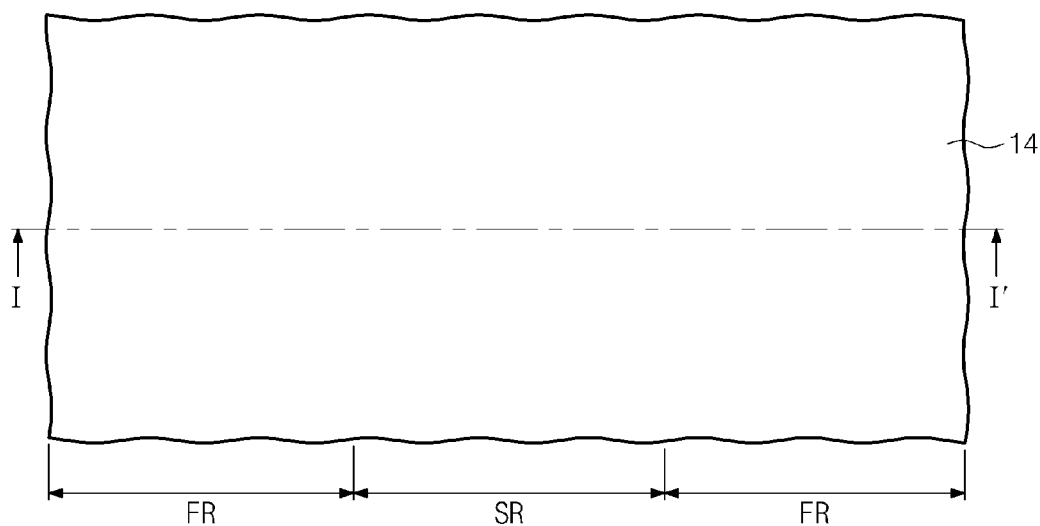
Figure 20B:
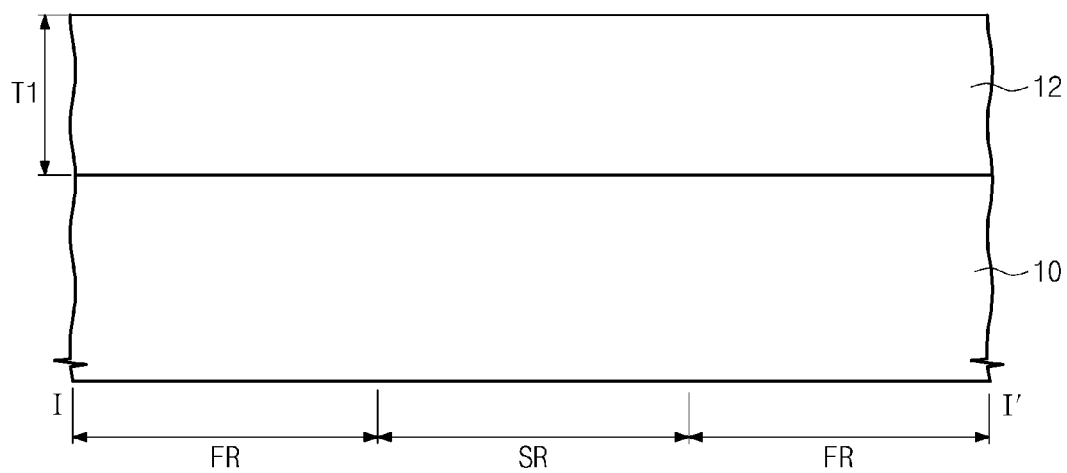

Referring to FIGS. 20A and 20B, the preliminary channel layer 12 may be formed on the substrate 10. The substrate 10 may be, for example, a silicon substrate, and the preliminary channel layer 12 may be, for example, a silicon layer. The preliminary channel layer 12 may be formed on the substrate 10 using a selective epitaxial growth process. The preliminary channel layer 12 may be formed to have a thickness T1.

Figure 21A:
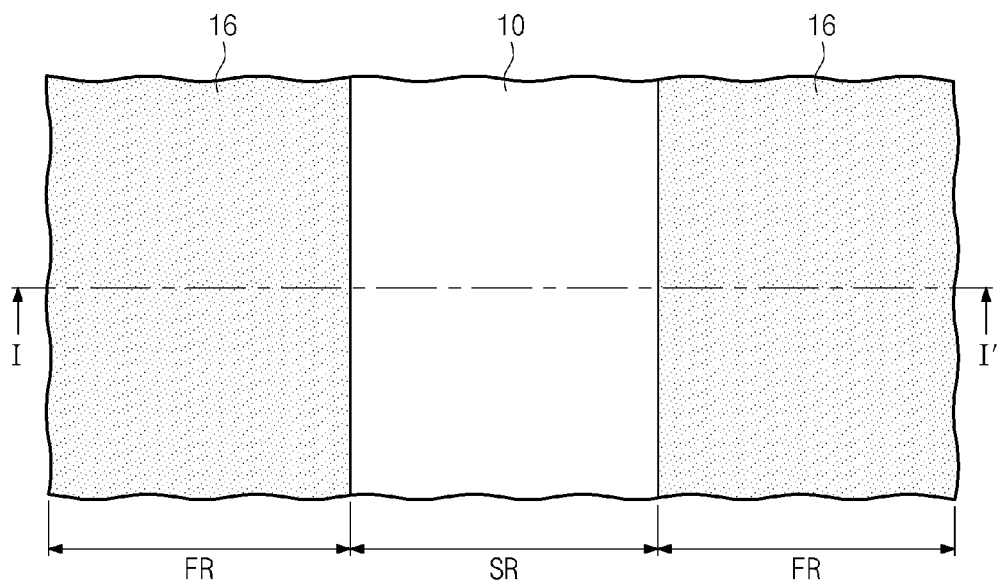
Figure 21B:
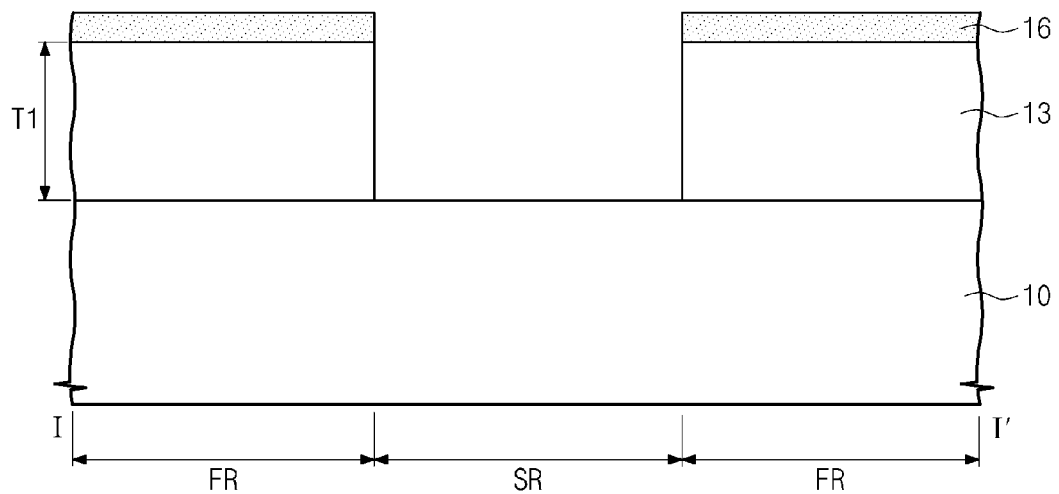

Referring to FIGS. 21A and 21B, the mask pattern 16 may be formed on the preliminary channel layer 12. In detail, the mask pattern 16 may be formed to cover the preliminary channel layer 12 on the first regions FR of the substrate 10. The preliminary channel layer 12 exposed by the mask pattern 16 may be etched to form the first channel layer 13 on the first regions FR of the substrate 10. The first channel layer 13 may have the same thickness (i.e., T1) as that of the preliminary channel layer 12. A portion of the preliminary channel layer 12 may be removed from, for example, the second region SR of the substrate 10. The mask pattern 16 may be formed of or include at least one of, for example, a silicon oxide layer or a silicon nitride layer.

Figure 22A:
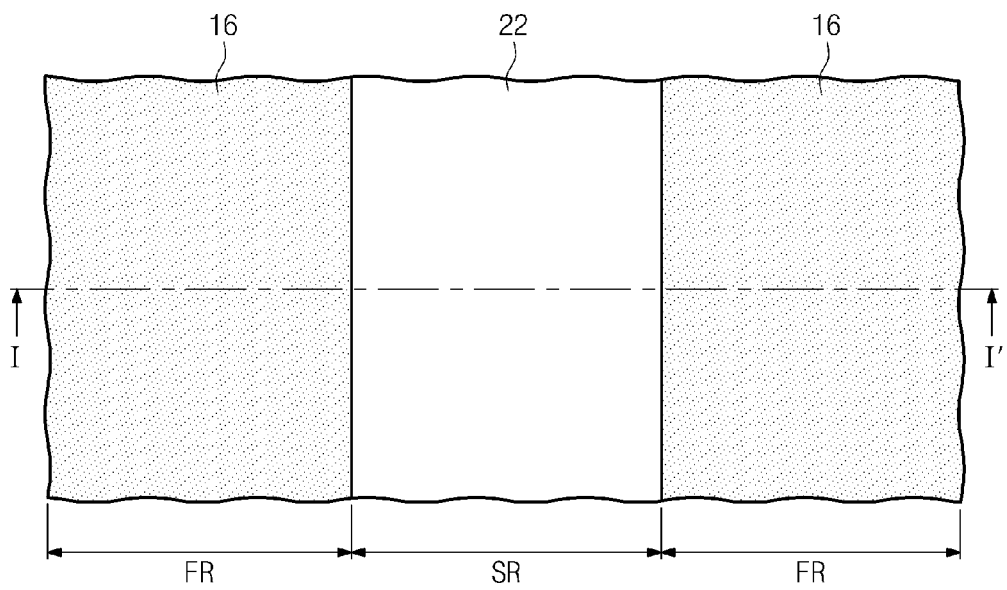
Figure 22B:
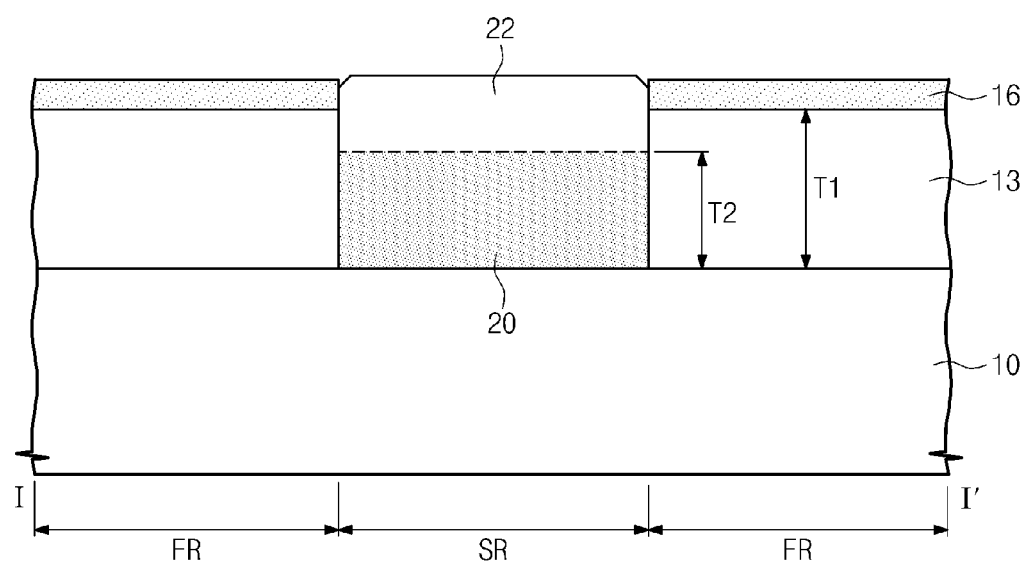

Referring to FIGS. 22A and 22B, the second channel layer 20 may be formed on the second region SR of the substrate 10. For example, the second channel layer 20 may be epitaxially grown using the substrate 10 and the first channel layer 13 as a seed layer and concurrently using a germanium-containing gas as a process gas, and thus, the second channel layer 20 may be a layer of silicon germanium. The second channel layer 20 may have a thickness of T2, which is smaller than a critical thickness for preventing or reducing a lattice defect or a strained relaxation from occurring in silicon germanium lattices of the second channel layer 20. For example, the thickness T2 of the second channel layer 20 may be smaller than the thickness T1 of the first channel layer 13, and thus, the top surface of the second channel layer 20 may be positioned at a level lower than that of the first channel layer 13.

The second sacrificial layer 22 may be formed on the second channel layer 20. In example embodiments, the second sacrificial layer 22 may be formed to have a top surface protruding from a top surface of the mask pattern 16. The second sacrificial layer 22 may be a silicon-germanium (SiGe) layer having a Ge content lower than that of the second channel layer 20.

Figure 23A:
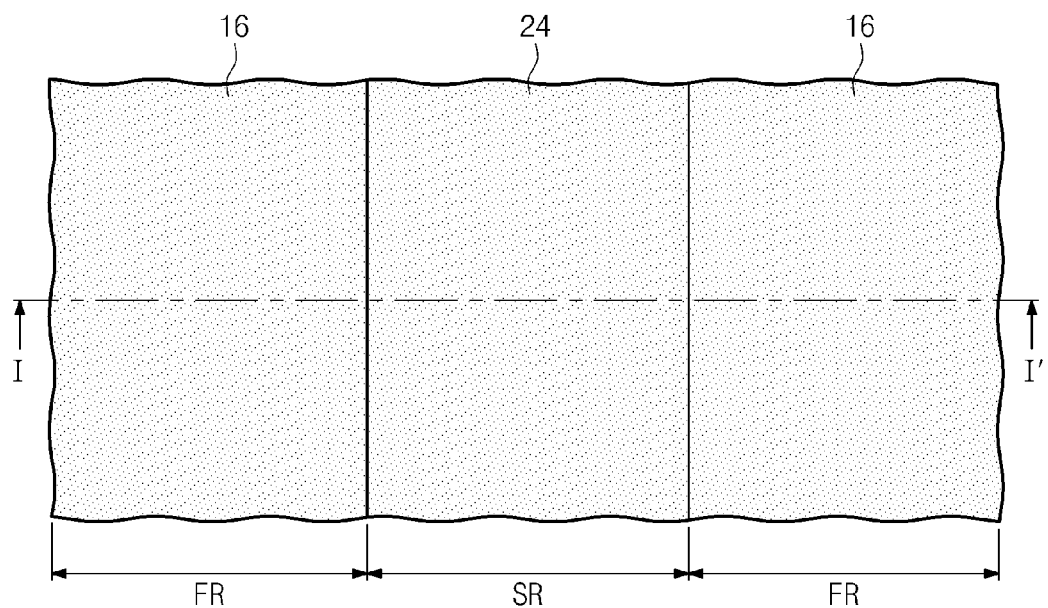
Figure 23B:
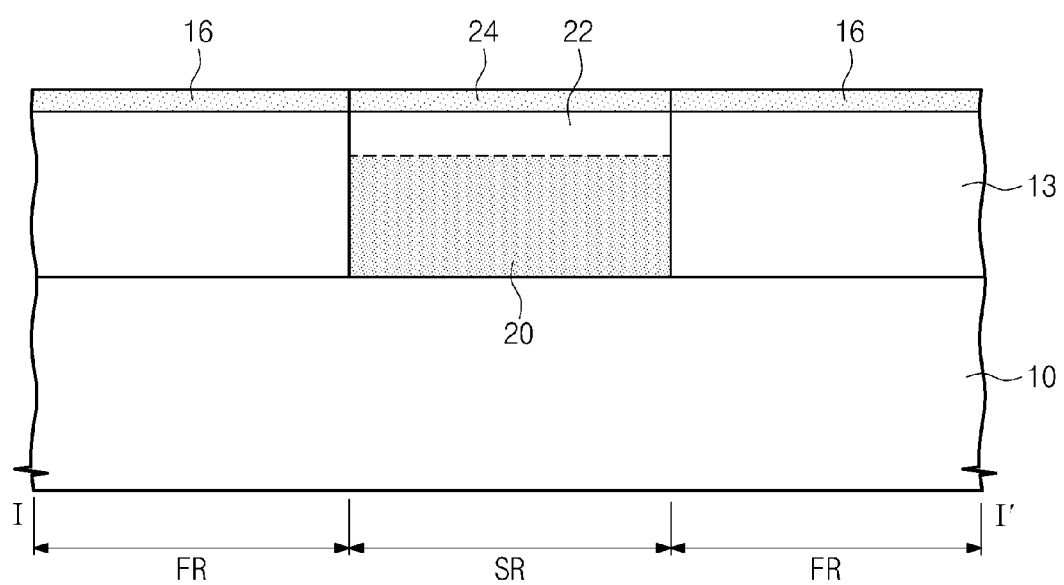

Referring to FIGS. 23A and 23B, a polishing process using the mask pattern 16 as a polishing stop layer may be performed on the second sacrificial layer 22. For example, the second sacrificial layer 22 may be polished to have the top surface that is coplanar with that of the mask pattern 16.

The buffer layer 24 may be formed in an upper region of the second sacrificial layer 22. The buffer layer 24 may be formed by performing a surface treatment process on the second sacrificial layer 22. The buffer layer 24 may be formed of substantially the same material as that of the mask pattern 16. For example, the buffer layer 24 may be formed of silicon oxide or silicon nitride. The surface treatment process may be performed in such a way that the second sacrificial layer 22 and the first channel layer 13 have top surfaces that are coplanar with each other.

Figure 24A:
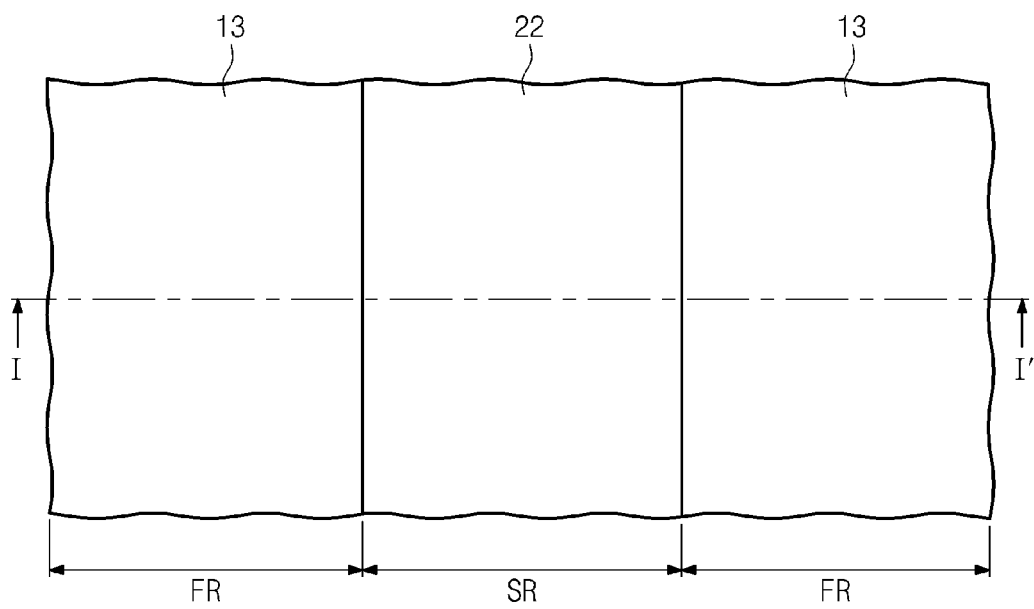
Figure 24B:
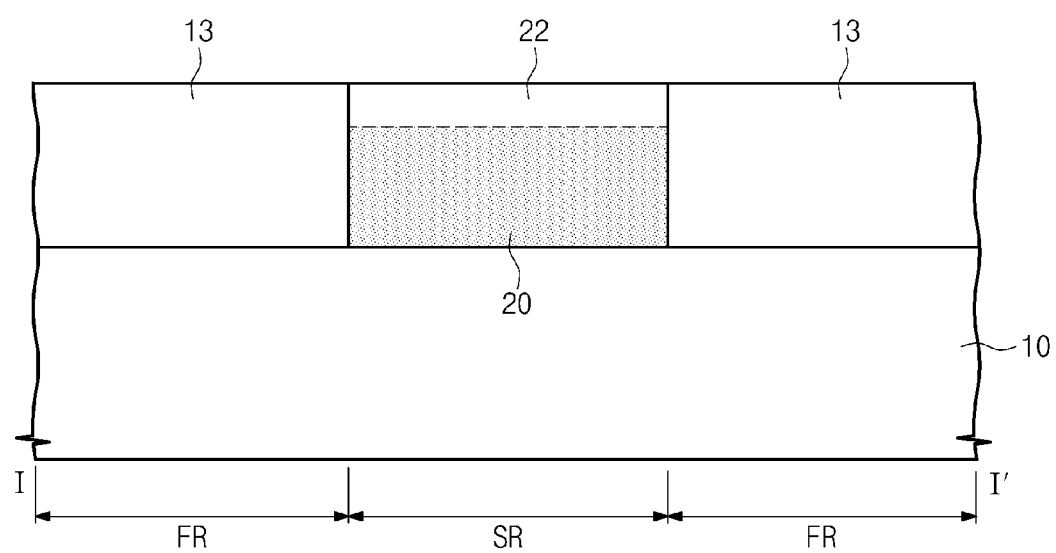

Referring to FIGS. 24A and 24B, the buffer layer 24 and the mask pattern 16 may be removed simultaneously through a single process. Accordingly, the top surfaces of the second sacrificial layer 22 and the first channel layer 13 may be exposed.

Figure 25A:
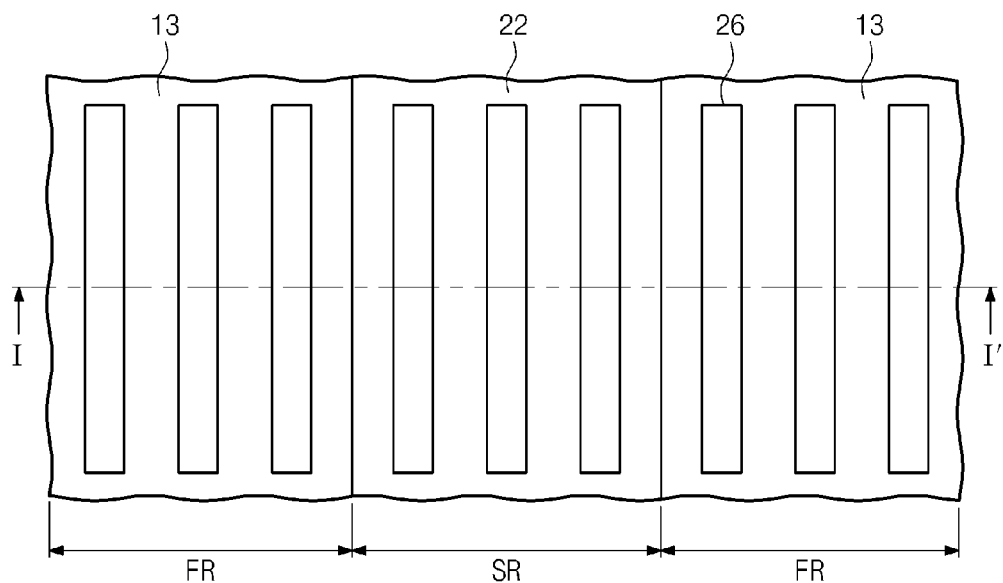
Figure 25B:
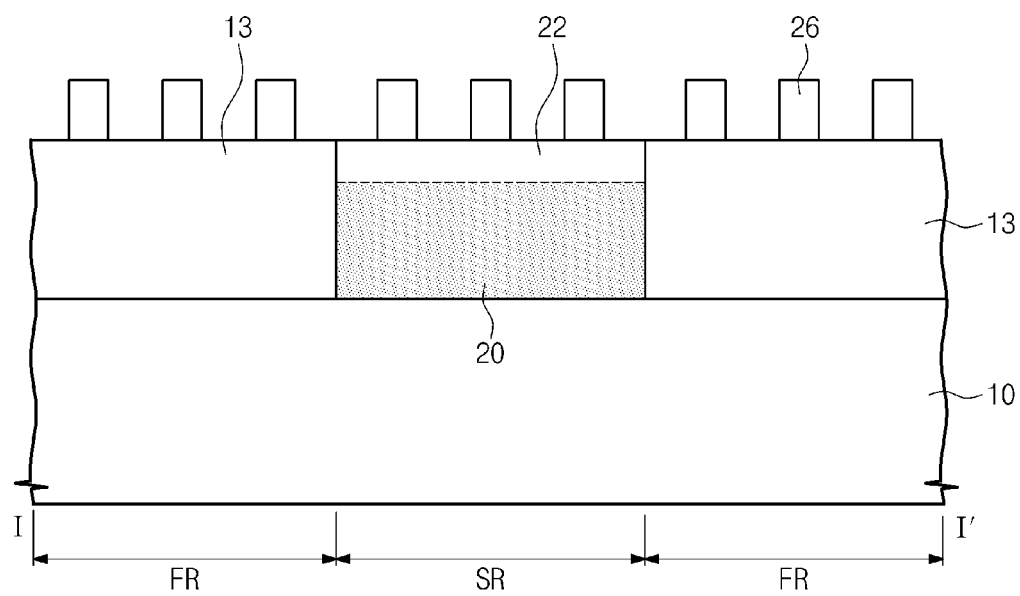

Referring to FIGS. 25A and 25B, the hardmask pattern 26 may be formed on the first channel layer 13 and second sacrificial layers 22. The hardmask pattern 26 may be formed of a material (e.g., silicon nitride) having an etch selectivity with respect to the first channel layer 13 and the second sacrificial layer 22.

Figure 26A:
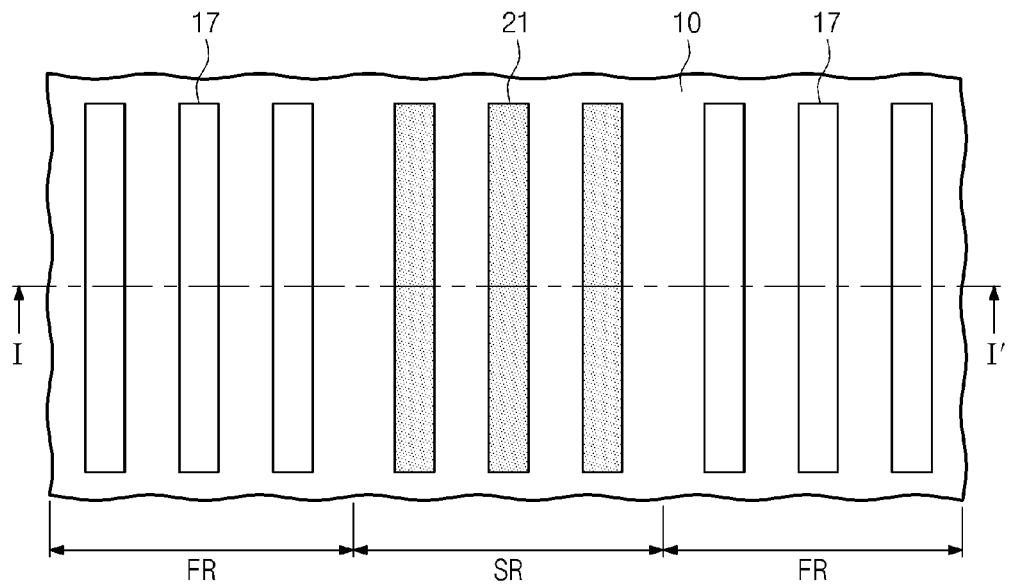
Figure 26B:
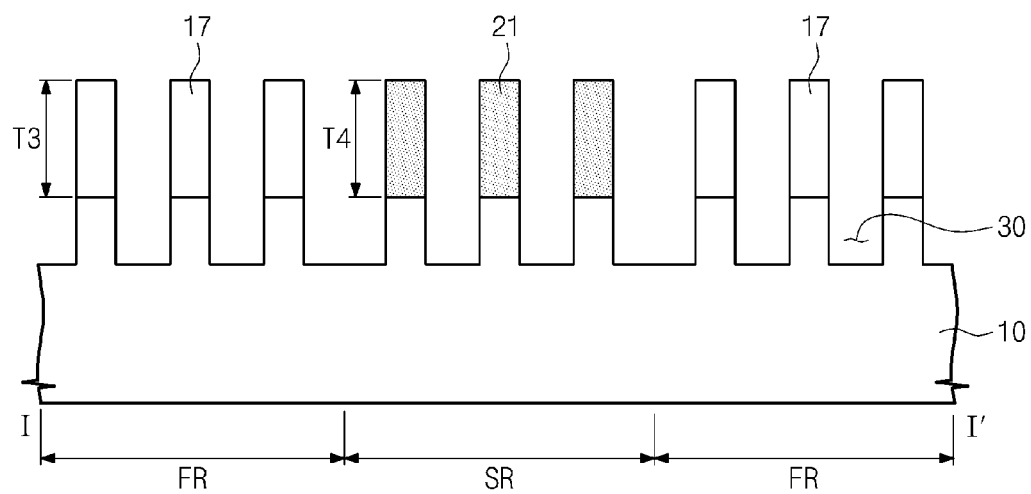

Referring to FIGS. 26A and 26B, the first channel layer 13, the second sacrificial layer 22 and the second channel layer 20 may be patterned using the hardmask pattern 26 as an etch mask to form the first and second channel portions 17 and 21. Further, the substrate 10 may be partially etched to recess the top surface of the substrate 10. Accordingly, the recess region 30 may be formed in an upper portion of the substrate 10 and between each pair of the first and second channel portions 17 and 21.

In detail, the first channel portion 17 may be formed by patterning the first channel layer 13 using the hardmask pattern 26, which is disposed on the first regions FR, as an etch mask, and the second channel portion 21 may be formed by patterning the second sacrificial layer 22 and the second channel layer 20 using the hardmask pattern 26, which is disposed on the second regions SR, as an etch mask. The hardmask pattern 26 may be removed in the process of patterning the first and second channel layers 13 and 20.

Here, if the hardmask pattern 26 is removed, the second sacrificial layer 22 may be exposed on the second region SR of the substrate 10, and thus, the second sacrificial layer 22 may be etched and removed in the processes of patterning the second channel layer 20 and/or recessing the top surface of the substrate 10. By contrast, if the hardmask pattern 26 is removed, the first channel layer 13 on the first regions FR of the substrate 10 may be etched in the processes of pattering the first channel layer 13 and/or recessing the top surface of the substrate 10. Accordingly, the first channel portion 17 may be formed to have a thickness T3 smaller than the thickness T1 of the first channel layer 13 or have a top surface positioned at a lower level than that of the first channel layer 13. The second channel portion 21 may be formed to have a thickness T4, which is substantially equal to the thickness T2 of the second channel layer 20, and have a top surface that is coplanar with that of the second channel layer 20. The thickness T3 of the first channel portion 17 may be substantially equal to the thickness T4 of the second channel portion 21, and the first and second channel portions 17 and 21 may have the top surfaces that are substantially coplanar with each other.

Figure 27A:
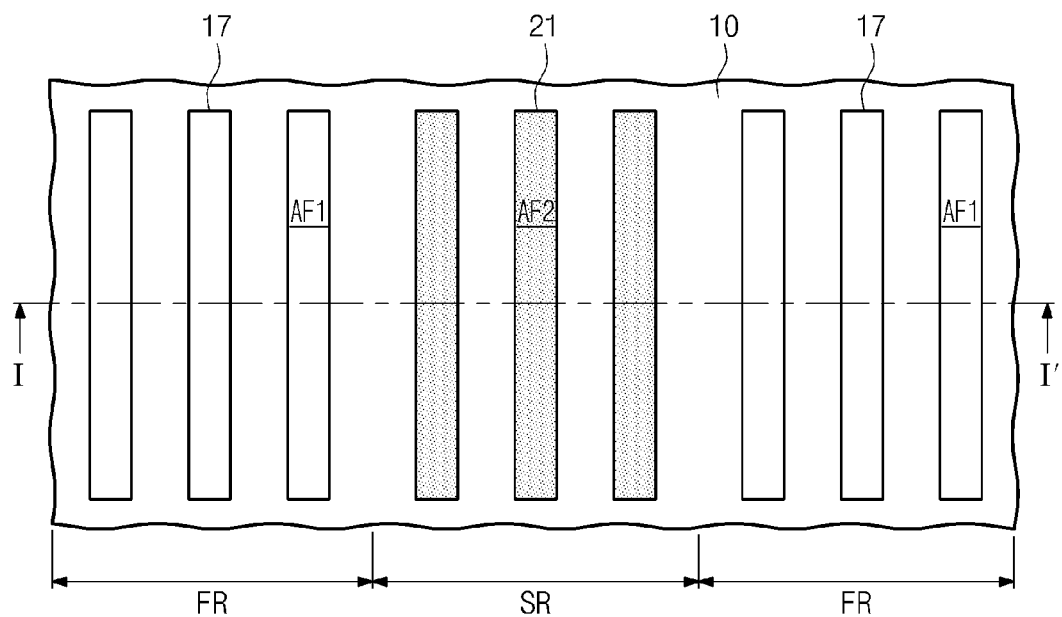
Figure 27B:
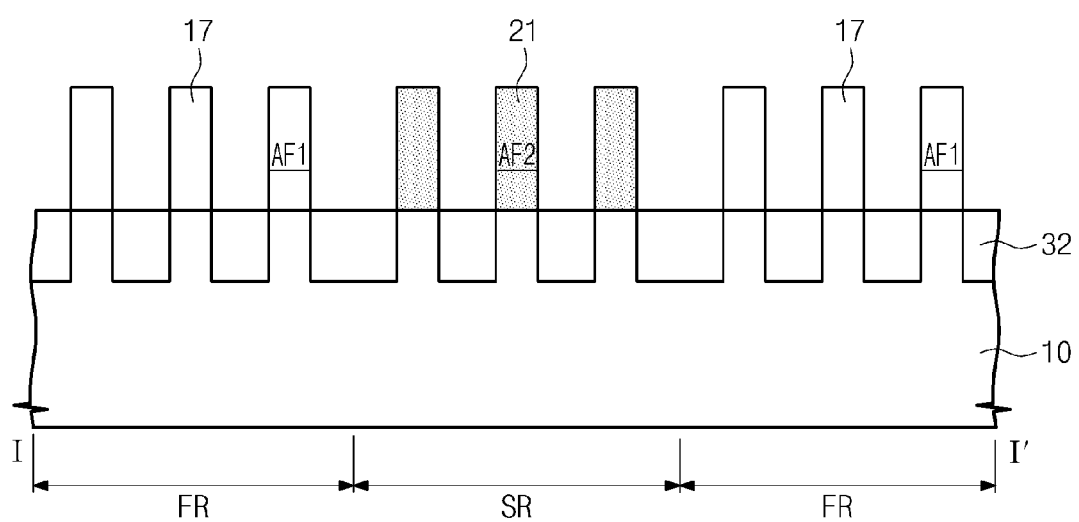

Referring to FIGS. 27A and 27B, the device isolation layer 32 may be formed on the substrate 10 to fill the recess region 30. As a result of the formation of the device isolation layer 32, the first channel portion 17 formed on the second region SR of the substrate 10 may be used as a first active fin AF1, and the second channel portion 21 formed on the second region SR of the substrate 10 may be used as a second active fin AF2.

Figure 28A:
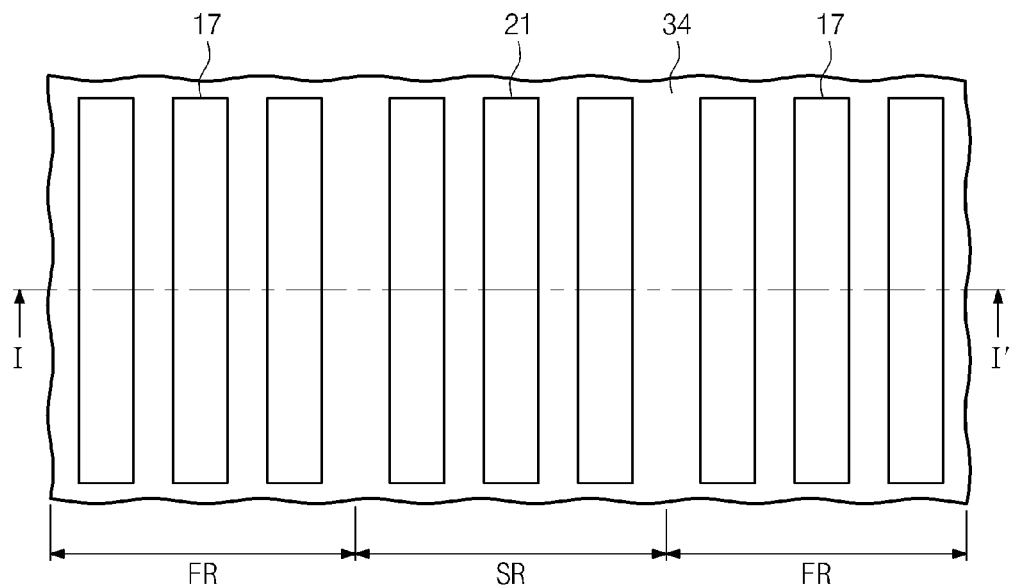
Figure 28B:
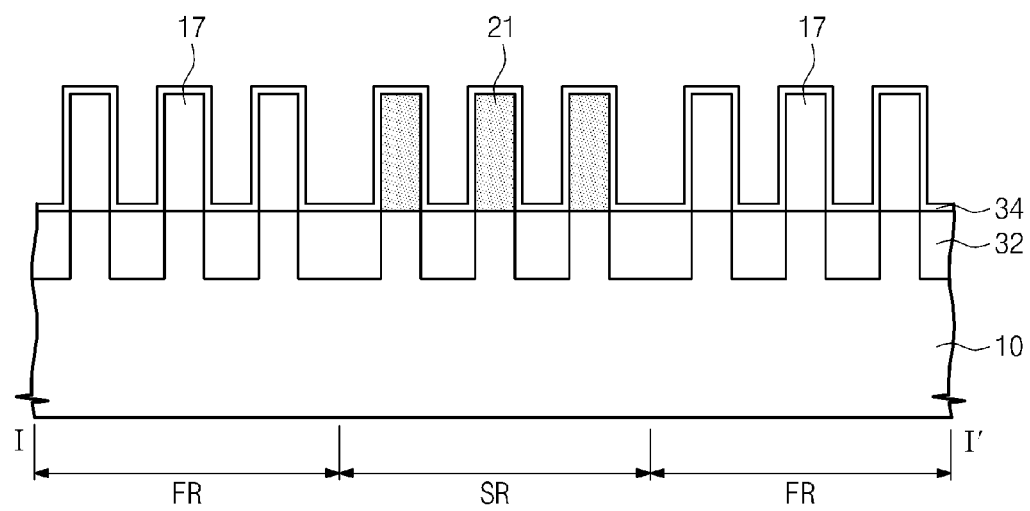

Referring to FIGS. 28A and 28B, the gate insulating layer 34 may be formed on the substrate 10 to conformally cover the exposed surfaces of the first and second channel portions 17 and 21 and the top surface of the device isolation layer 32.

Referring back to FIGS. 12A and 12B, the gate electrode 36 may be formed on the gate insulating layer 34 to cross at least one of the first and second active fins AF1 and AF2. Source/drain regions (not shown) may be formed in the substrate 10 exposed by the gate electrode 36.

FIGS. 29A through 33A are plan views illustrating a method of fabricating a semiconductor device according to even other example embodiments of the inventive concepts. FIGS. 29B through 33B are sectional views illustrating a method of fabricating a semiconductor device according to even other example embodiments of the inventive concepts, taken along line II-II' of FIGS. 29A through 33A, respectively. For concise description, a previously described element may be identified by a similar or identical reference number without repeating an overlapping description thereof.

Figure 29A:
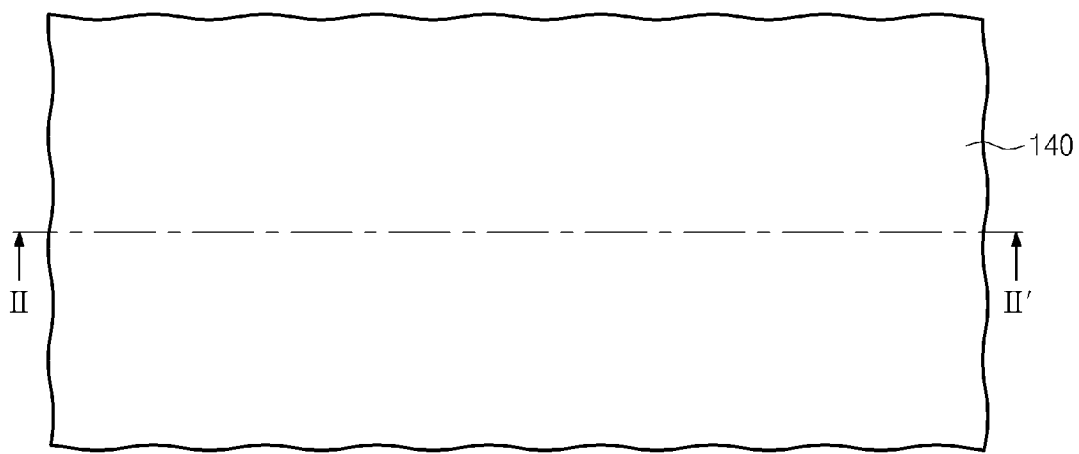
Figure 29B:
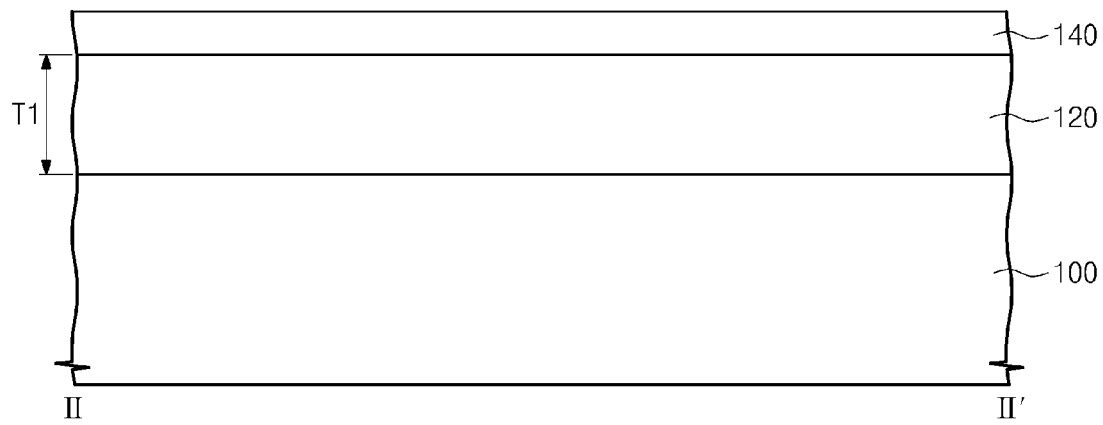

Referring to FIGS. 29A and 29B, a preliminary channel layer 120 may be formed on a substrate 100. The substrate 100 may be, for example, a silicon substrate or a silicon-germanium ($Si_{1-x}Ge_x$, 0≤x<1) substrate. The preliminary channel layer 120 may be a silicon layer or a silicon-germanium ($Si_{1-y}Ge_y$, 0≤y<1) layer. As an example, in the case where the substrate 100 is the silicon substrate, the preliminary channel layer 120 may be a silicon layer or a silicon germanium ($Si_{1-y}Ge_y$, 0≤y<1) layer. In other words, if a germanium content $Ge_x$ of the substrate 100 is zero, a germanium content $Ge_y$ of the preliminary channel layer 120 may be equal to or higher than zero (i.e., x≤y). As another example, if the substrate 100 is the silicon-germanium ($Si_{1-x}Ge_x$, 0≤x<1) substrate, the preliminary channel layer 120 may be a silicon-germanium layer, and the germanium content $Ge_x$ of the substrate 100 may be lower than the germanium content $Ge_y$ of the preliminary channel layer 120 (i.e., x<y). The preliminary channel layer 120 may have a thickness of T1 (i.e., a distance between bottom and top surfaces thereof), which is smaller than a critical thickness for preventing or reducing a lattice defect or a strained relaxation from occurring in silicon germanium lattices of the preliminary channel layer 120. The preliminary channel layer 120 may be formed by a deposition process or a selective epitaxial growth process.

A sacrificial layer 140 may be formed on the preliminary channel layer 120. The sacrificial layer 140 may be formed by a selective epitaxial growth process. The sacrificial layer 140 may be formed to have a germanium content $Ge_z$ higher than a germanium content $Ge_y$ of the preliminary channel layer 120 (i.e., y<z). The germanium content $Ge_z$ of the sacrificial layer 140 may be determined in consideration of a difference in germanium content between the substrate 100 and the preliminary channel layer 120 (e.g., $|Ge_x-Ge_y|$) and/or the thickness of the preliminary channel layer 120.

Figure 30A:
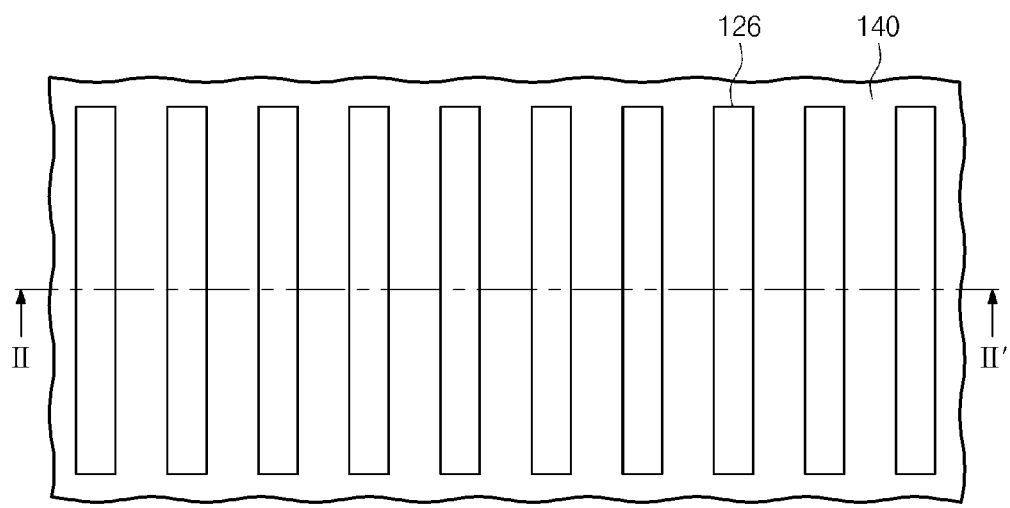
Figure 30B:
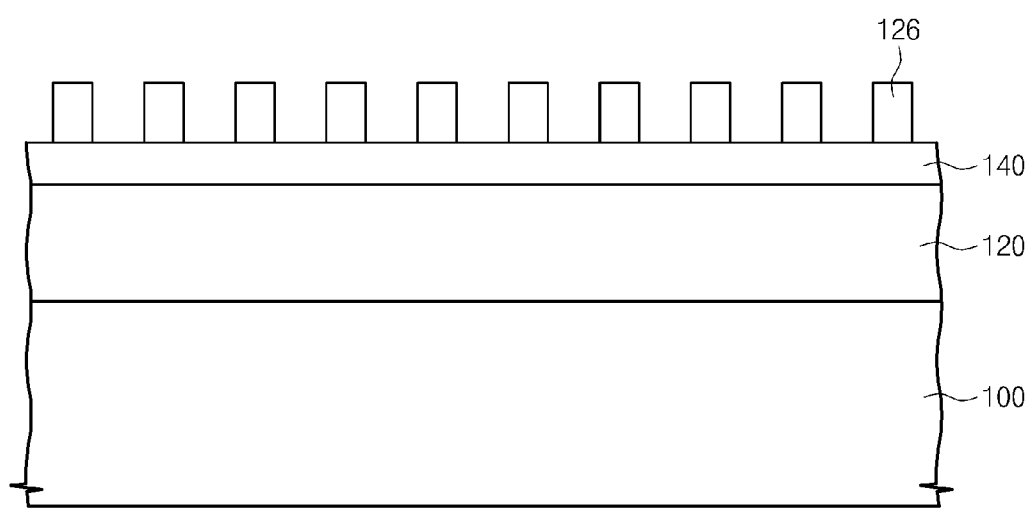

Referring to FIGS. 30A and 30B, a hardmask pattern 126 may be formed on the sacrificial layer 140. The hardmask pattern 126 may be formed of a material (e.g., silicon nitride) having an etch selectivity with respect to the sacrificial layer 140.

Figure 31A:
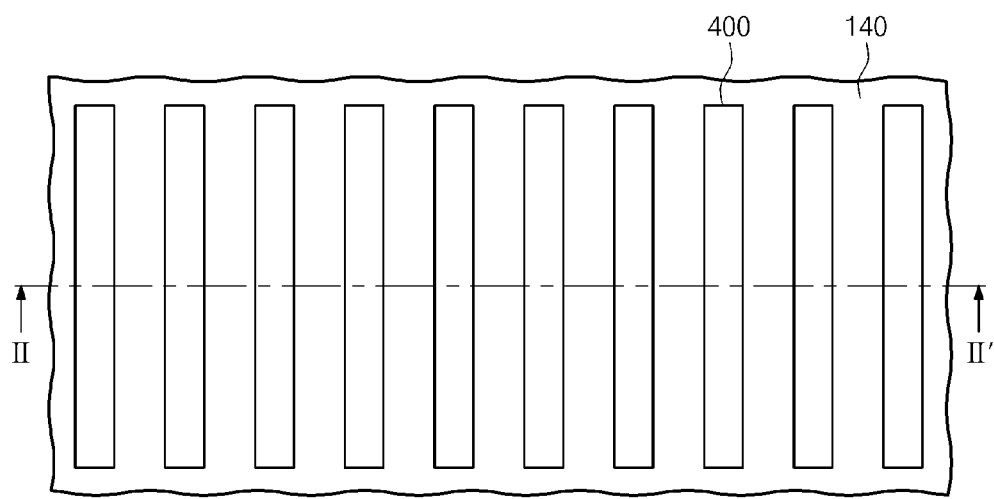
Figure 31B:
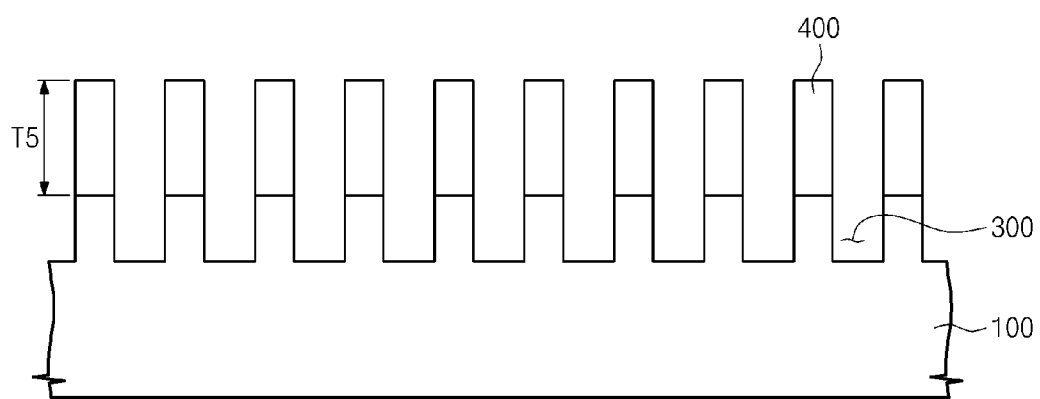

Referring to FIGS. 31A and 31B, the sacrificial layer 140 and the preliminary channel layer 120 may be patterned using the hardmask pattern 126 as an etch mask to form a channel portion 400. The hardmask pattern 126 may be etched and removed in the process of patterning the sacrificial layer 140 and the preliminary channel layer 120, and moreover, the sacrificial layer 140 exposed by the removal of the hardmask pattern 126 may be etched and removed in the process of patterning the preliminary channel layer 120. The top surface of the substrate 100 may be partially etched to form a recess region 300 in the substrate 100.

The channel portion 400 may be formed to have a thickness of T5 (e.g., a distance between bottom and top surfaces thereof), which is substantially equal to the thickness T1 of the preliminary channel layer 120, and have a top surface positioned at substantially the same level as that of the preliminary channel layer 120.

Figure 32A:
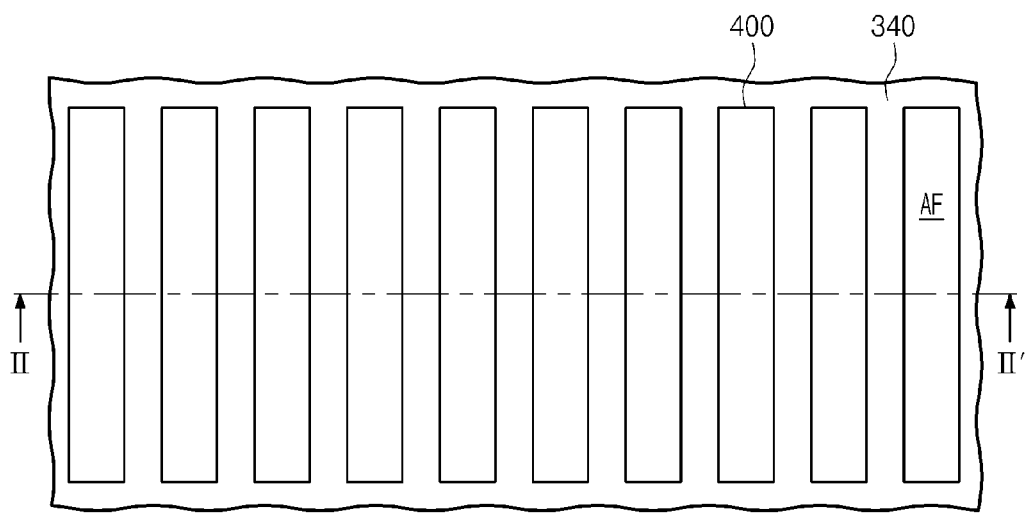
Figure 32B:
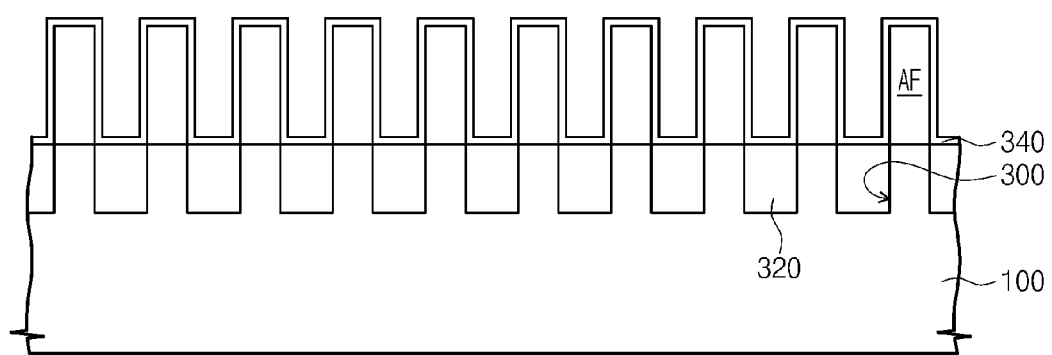

Referring to FIGS. 32A and 32B, a device isolation layer 320 may be formed in the recess region 300, and thus, the channel portion 400 may be used as an active fin AF. A gate insulating layer 340 may be formed to conformally cover a top surface of the device isolation layer 320 and an exposed surface of the channel portion 400.

Figure 33A:
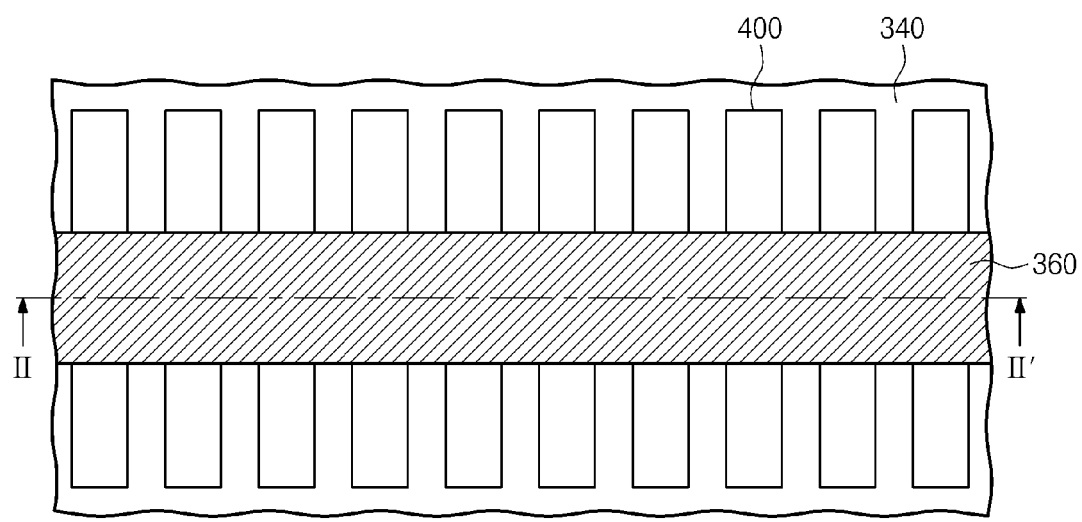
Figure 33B:
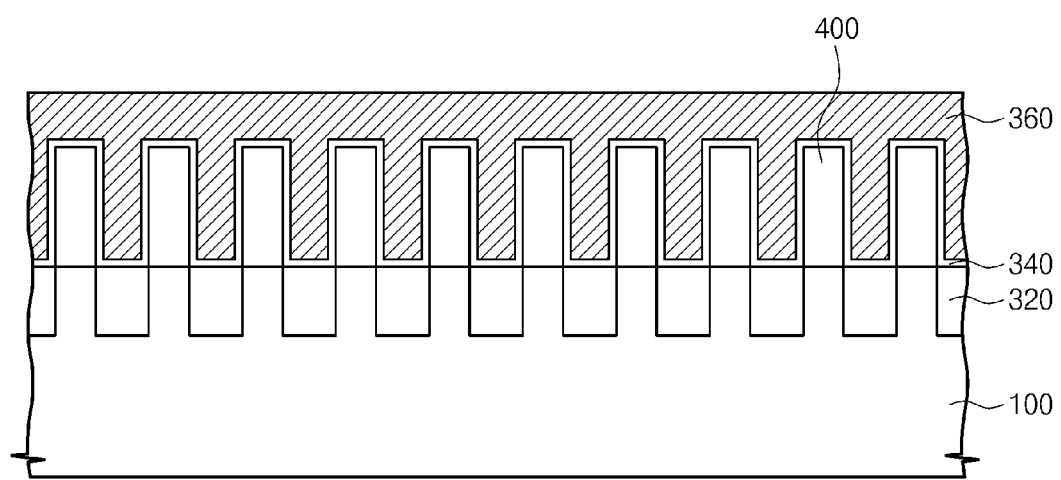

Referring to FIGS. 33A and 33B, a gate electrode 360 may be formed on the substrate 100 to cross the active fin AF. The gate electrode 360 may be formed of or include, for example, poly silicon or a metallic material. Source/drain regions (not shown) may be formed in the substrate 100 exposed by the gate electrode 360.

Figure 34:
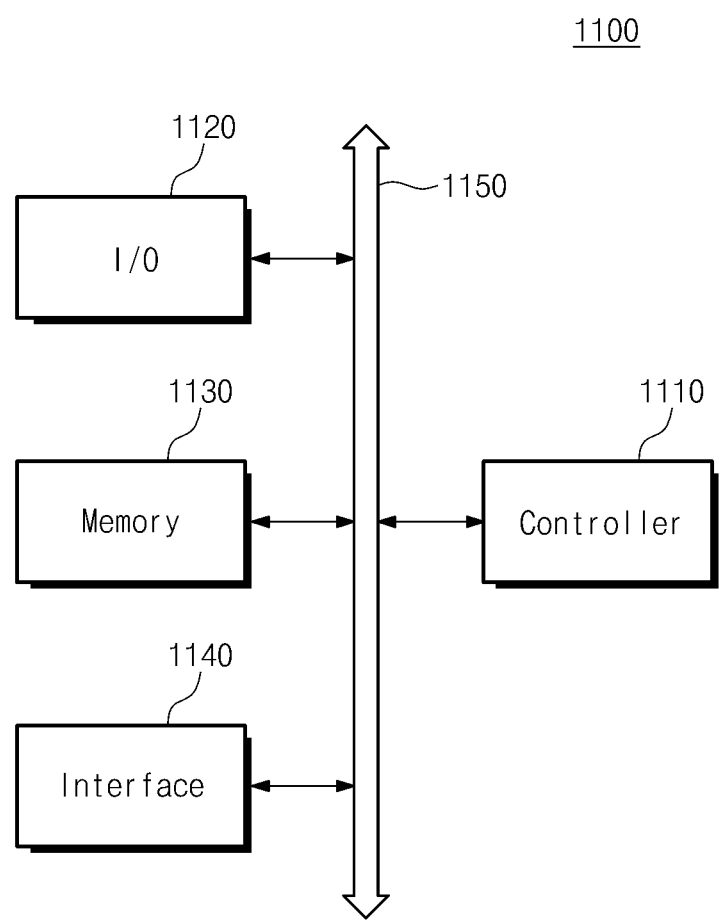
FIG. 34 is a schematic block diagram illustrating an example of electronic systems including a semiconductor device according to example embodiments of the inventive concepts.

FIG. 34 is a schematic block diagram illustrating an example of electronic systems including a semiconductor device according to example embodiments of the inventive concepts.

Referring to FIG. 34, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110. A semiconductor device according to example embodiments of the inventive concepts may be provided in the memory device 1130 or as a part of the controller 1110 and/or the I/O unit 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data by wireless.

The electronic system 1100 can be applied to realize various electronic devices.

Figure 35:
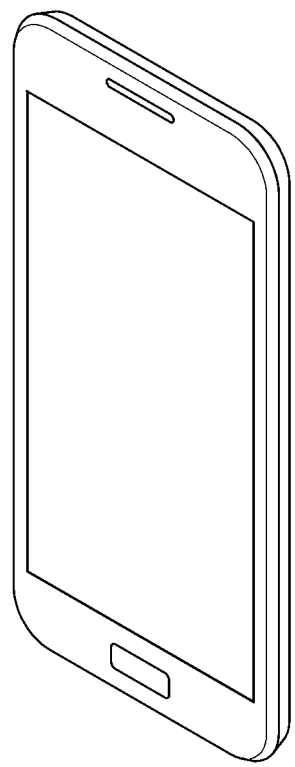
FIG. 35 is a schematic view illustrating an example of various electronic devices, to which an electronic system according to example embodiments of the inventive concepts can be applied.

FIG. 35 is a schematic view illustrating an example of various electronic devices, to which the electronic system 1100 of FIG. 34 can be applied. As shown in FIG. 35, the electronic system 1100 of FIG. 34 can be applied to realize a mobile phone 1200. However, it will be understood that, in other embodiments, the electronic system 1100 of FIG. 34 may be applied to portable notebook computers, MP3 players, navigators, solid state disks (SSDs), automobiles, and/or household appliances.

According to example embodiments of the inventive concepts, a method of fabricating a semiconductor device may include forming a sacrificial layer on a channel layer. Here, the sacrificial layer may be formed to have a germanium content that is higher or lower than that of a channel layer. The sacrificial layer may be removed in a subsequent process of patterning the channel layer and thereby forming an active fin, and thus, it is possible to prevent an upper portion of the active fin from being etched. In other words, the use of the sacrificial layer makes it possible to prevent or reduce a reduction in height of the active fin.

According to other example embodiments of the inventive concepts, a method of fabricating a semiconductor device may include forming a first sacrificial layer on a first region of a substrate and performing a surface treatment process on the first sacrificial layer to form a buffer layer. The first sacrificial layer may be formed to be thicker than a second sacrificial layer provided on a second region of the substrate, and thus, there may be a difference in height between the first and second sacrificial layers. However, the formation of the buffer layer makes it possible to reduce the difference in height between the first and second sacrificial layers.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   forming a preliminary channel layer on a substrate including a first region and a second region;
   forming a mask pattern on the first region of the substrate to cover the preliminary channel layer;
   etching the preliminary channel layer exposed by the mask pattern to form a first channel layer on the first region of the substrate;

forming a second channel layer on the second region of the substrate;

forming a first sacrificial layer on the second channel layer;

performing a surface treatment process on the first sacrificial layer to form a buffer layer in an upper region of the first sacrificial layer, the buffer layer having a bottom surface coplanar with a bottom surface of the mask pattern;

selectively removing the mask pattern and the buffer layer to expose top surfaces of the first sacrificial layer and the first channel layer;

forming a hardmask pattern on the first channel layer and the first sacrificial layer; and etching the first and second channel layers using the hardmask pattern as an etch mask to form a first channel portion and a second channel portion.

2. The method of claim 1, wherein each of the first and second channel layers is one of a silicon layer and a silicon germanium layer.

3. The method of claim 2, wherein
the substrate is one of a silicon substrate and a silicon germanium substrate, and
the first and second channel layers have a germanium content higher than or equal to that of the substrate.

4. The method of claim 1, wherein
the etching the preliminary channel layer forms the first channel layer having a first thickness T1,
the forming a second channel layer forms the second channel layer having a second thickness T2, and
T1>T2.

5. The method of claim 4, wherein
the etching the first and second channel layers forms the first channel portion having a top surface at a level lower than that of the first channel layer,
the etching the first and second channel layers forms the second channel portion having a top surface at a same level as that of the second channel layer, and
the top surfaces of the first and second channel portions are formed at a same level.

6. The method of claim 1, wherein the forming a second channel layer forms a silicon-germanium layer using an epitaxial growth process in which a top surface of the substrate is used as a seed layer, and the silicon-germanium layer has a germanium content higher than that of the first channel layer.

7. The method of claim 6, wherein the forming a first sacrificial layer forms the first sacrificial layer having a germanium content lower than that of the second channel layer.

8. The method of claim 1, wherein the forming a first sacrificial layer comprises:
forming the first sacrificial layer using an epitaxial growth process performed continuously after the forming a second channel layer, the first sacrificial layer including a portion protruding upward from the mask pattern; and
polishing the first sacrificial layer to have a top surface coplanar with that of the mask pattern.

9. The method of claim 1, further comprising:
forming a second sacrificial layer on the preliminary channel layer before the forming a mask pattern,
wherein the etching the preliminary channel layer etches the second sacrificial layer and the preliminary channel layer using the mask pattern as an etch mask to form the first channel layer and a second sacrificial layer on the first region of the substrate.

10. The method of claim 9, wherein the forming a second sacrificial layer forms a silicon-germanium layer having a germanium content higher than that of the preliminary channel layer.

11. The method of claim 9, wherein the first and second channel layers are formed to have a same thickness.

12. The method of claim 11, wherein
the etching the first and second channel layers forms the first channel portion to have a top surface at a same level as that of the first channel layer, and
the etching the first and second channel layers forms the second channel portion to have a top surface at a same level as that of the second channel layer.

13. The method of claim 1, wherein the etching the first and second channel layers comprises:
removing the hardmask pattern to expose a top surface of the first sacrificial layer; and
etching the exposed first sacrificial layer to expose top surfaces of the first and second channel portions.

14. A method of fabricating a semiconductor device, comprising:
forming first and second epitaxial layers on respective first and second regions of a substrate;
forming a first sacrificial layer on the first epitaxial layer and a second sacrificial layer on the second epitaxial layer, the first sacrificial layer being a silicon germanium (SiGe) layer having a germanium content higher than that of the first epitaxial layer and the second sacrificial layer being a SiGe layer having a germanium content lower than that of the second epitaxial layer; and
etching the first and second sacrificial layers and the first and second epitaxial layers to form a first active fin and a second active fin,
wherein the forming first and second epitaxial layers forms the first epitaxial layer to have a germanium content different from a germanium content of the second epitaxial layer.

15. The method of claim 14, wherein the etching etches the substrate to form a recess region.

16. The method of claim 15, further comprising:
forming a device isolation layer filling the recess region.

17. The method of claim 14, wherein
the etching forms the first active fin to have a top surface at a same level as that of the first epitaxial layer, and
the etching forms the second active fin to have a top surface at a same level as that of the second epitaxial layer.

* * * * *